(12) United States Patent
Nakajima et al.

(10) Patent No.: US 11,215,643 B2
(45) Date of Patent: Jan. 4, 2022

(54) CLAMP SENSOR AND MEASURING DEVICE

(71) Applicant: HIOKI E.E. CORPORATION, Nagano (JP)

(72) Inventors: Kentaro Nakajima, Nagano (JP); Tetsuya Nakamura, Nagano (JP); Takeaki Miyazawa, Nagano (JP); Yusuke Abe, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 0 days.

(21) Appl. No.: 16/768,456

(22) PCT Filed: Feb. 1, 2019

(86) PCT No.: PCT/JP2019/003597
§ 371 (c)(1),
(2) Date: May 29, 2020

(87) PCT Pub. No.: WO2019/159718
PCT Pub. Date: Aug. 22, 2019

(65) Prior Publication Data
US 2020/0386789 A1   Dec. 10, 2020

(30) Foreign Application Priority Data

Feb. 19, 2018  (JP) .............................. JP2018-026954
Jul. 3, 2018   (JP) .............................. JP2018-126845
Jan. 8, 2019   (JP) .............................. JP2019-001098

(51) Int. Cl.
*G01R 1/22*   (2006.01)
*G01R 15/18*  (2006.01)

(52) U.S. Cl.
CPC .............. *G01R 1/22* (2013.01); *G01R 15/18* (2013.01)

(58) Field of Classification Search
CPC .......................... G01R 15/18–186; G01R 1/22
See application file for complete search history.

(56) References Cited

U.S. PATENT DOCUMENTS 2,663,845 A      12/1953  Koch
2,842,739 A  *   7/1958  Lamb ....................... G01R 1/22
                                                      324/127

(Continued)

FOREIGN PATENT DOCUMENTS

DE   202009010265    5/2009
JP   54-97230        7/1979

(Continued)

OTHER PUBLICATIONS

Official Communication issued in International Bureau of WIPO Patent Application No. PCT/JP2019/003597, dated Apr. 9, 2019.

*Primary Examiner* — Jermele M Hollington
*Assistant Examiner* — Demetrius R Pretlow
(74) *Attorney, Agent, or Firm* — Greenblum & Bernstein, P.L.C.

(57) ABSTRACT

A clamped object is reliably clamped. A clamp sensor includes a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed. Front end portions of the clamp arms have a pair of facing surfaces that construct the outer circumferential surface and the inner circumferential surface of the ring-shaped body, a pair of facing surfaces that construct two side surfaces of the ring-shaped body, a pair of facing surfaces that are inclined to the facing surfaces, and a pair of facing surfaces that are inclined to the facing surfaces.

55 Claims, 13 Drawing Sheets

(56) References Cited

U.S. PATENT DOCUMENTS

| | | | | |
|---|---|---|---|---|
| 4,518,913 | A * | 5/1985 | Jackson | G01R 1/22 324/127 |
| 4,656,418 | A * | 4/1987 | Boston | G01R 1/22 324/127 |
| 5,039,970 | A * | 8/1991 | Cox | G01R 1/22 336/107 |
| 5,426,360 | A * | 6/1995 | Maraio | G01R 15/142 324/126 |
| 5,610,512 | A * | 3/1997 | Selcuk | G01R 1/04 324/127 |
| 6,091,237 | A * | 7/2000 | Chen | G01R 15/125 324/126 |
| 6,456,060 | B1 * | 9/2002 | Wiesemann | G01R 1/22 324/127 |
| 7,750,621 | B1 * | 7/2010 | Liu | G01R 1/06788 324/126 |
| 2005/0031013 | A1 * | 2/2005 | Blakeley, III | G01R 1/06788 374/120 |
| 2005/0184722 | A1 * | 8/2005 | Gregorec, Jr. | G01R 1/22 324/126 |
| 2007/0176895 | A1 | 8/2007 | Miyasaka et al. | |
| 2009/0058399 | A1 * | 3/2009 | Wang | G01R 1/22 324/127 |
| 2011/0101960 | A1 | 5/2011 | Wang et al. | |
| 2012/0020049 | A1 * | 1/2012 | Ko | G01R 15/12 362/23.07 |
| 2012/0169324 | A1 * | 7/2012 | Worones | G01R 1/22 324/126 |
| 2012/0307478 | A1 * | 12/2012 | Liu | G01D 11/28 362/23.22 |
| 2013/0033253 | A1 * | 2/2013 | Liu | G01R 1/22 324/115 |
| 2017/0102411 | A1 * | 4/2017 | Li | G01R 1/22 |
| 2017/0234909 | A1 * | 8/2017 | Tierney | G01R 15/186 324/127 |
| 2018/0224482 | A1 * | 8/2018 | Chien | G01R 15/186 |

FOREIGN PATENT DOCUMENTS

| | | |
|---|---|---|
| JP | 2007-199018 | 8/2007 |
| JP | 2013-231625 | 11/2013 |
| JP | 2015-190783 | 11/2015 |
| JP | 2016-11898 | 1/2016 |

* cited by examiner

F I G. 1 1
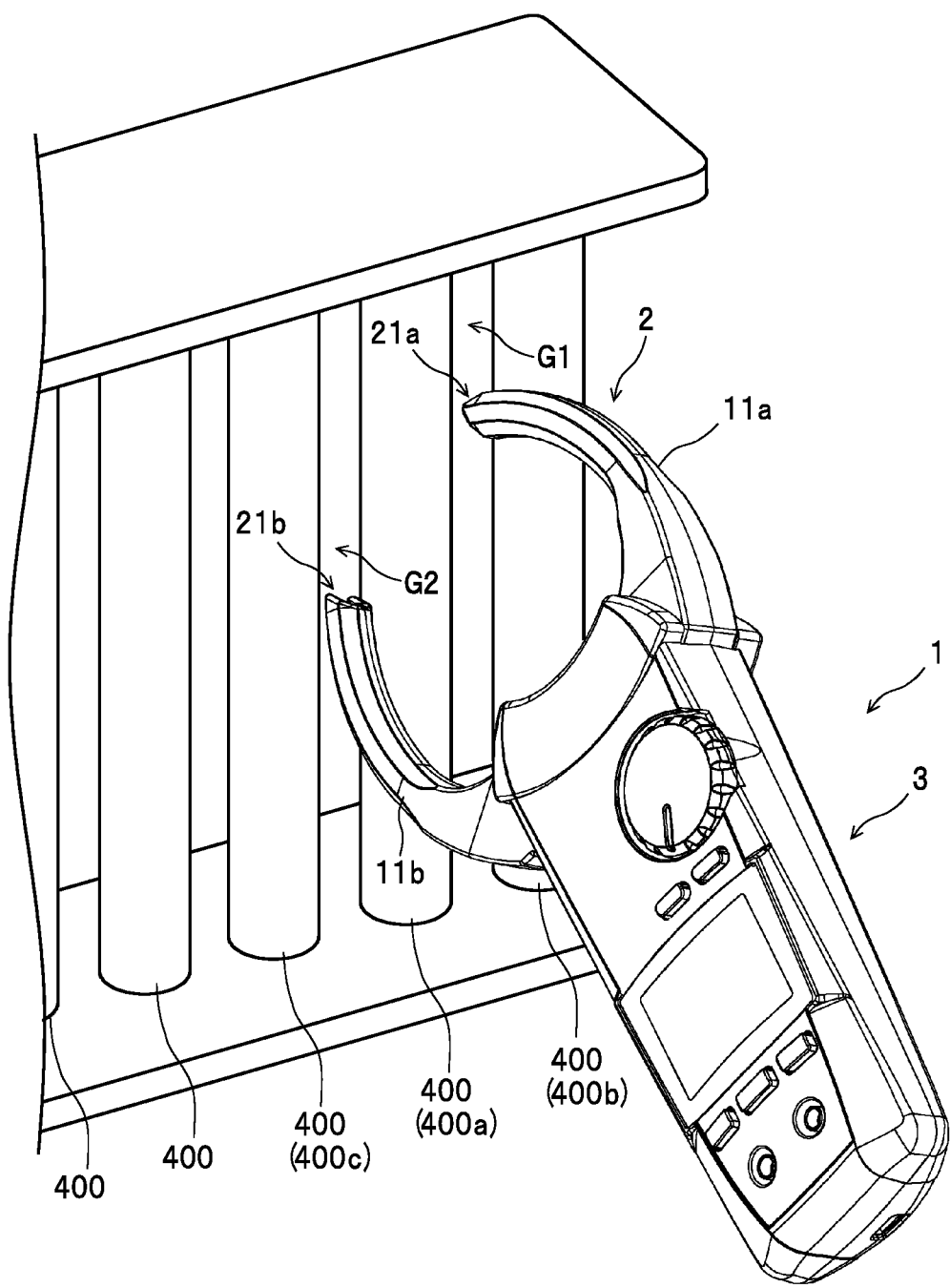

CLAMP SENSOR AND MEASURING DEVICE

TECHNICAL FIELD

The present invention relates to a clamp sensor that detects a detected value for a clamped object in a state where the clamped object has been clamped by a pair of clamp arms that are substantially arc-shaped in plan view, and to a measuring device that is equipped with the clamp sensor and measures a measured value for the clamped object.

BACKGROUND ART

As an example of this type of clamp sensor, the clamp sensor disclosed by the present applicant in Patent Literature 1 indicated below is known. This clamp sensor includes a movable sensor and a fixed sensor that are formed so as to be substantially arc-shaped in plan view. The movable sensor has a connecting pin inserted through a base end thereof to connect the movable sensor so as to be rotatable about the base end. When using this clamp sensor to detect a current flowing through an electric wire for example, a lever provided at the base end of the movable sensor is held. At this time, the movable sensor rotates so that the front ends of the sensors become separated. After this, the electric wire is passed through the separated front ends, and the holding of the lever is then released. Here, due to the biasing force of a spring, the front ends of the sensors are placed in contact with each other, so that the electric wire becomes surrounded and clamped by a ring-shaped body constructed by the sensors. The current flowing through the electric wire is then detected by the sensors.

CITATION LIST

Non Patent Literature

Patent Literature 1
  Japanese Laid-open Patent Publication No. 2007-17188 (see pages 4-5, FIG. 1)

SUMMARY OF INVENTION

Problem to be Solved by the Invention

However, the clamp sensor described above has the following problem to be solved. That is, with this type of clamp sensor including the clamp sensor described above, to achieve sufficient sensitivity, the sensors have to be formed with a relatively high thickness and are substantially square in cross section. This means that when using the clamp sensor described above, there is the problem to be solved that when other electric wires are disposed in the vicinity of the electric wire to be measured, or when there is an obstacle in the vicinity of the electric wire to be measured, it is difficult to insert the front ends of the sensors into the gaps between the wire to be measured and the other wires or obstacle, which prevents the wire to be measured from being clamped with the sensors.

The present invention was conceived in view of the above problem to be solved and has a principal object of providing a clamp sensor and a measuring device capable of reliably clamping a clamped object.

Solution to Problem

To achieve the stated object, the clamp sensor according to an aspect of this application comprises: a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed, wherein the clamp sensor is capable of detecting a detected value of a clamped object in a state where the clamped object is clamped by the clamp arms, front end portions of the clamp arms have a pair of first facing surfaces that construct an outer circumferential surface and an inner circumferential surface of the ring-shaped body, a pair of second facing surfaces that construct two side surfaces of the ring-shaped body, and a plurality of pairs of third facing surfaces that are inclined with respect to the first facing surfaces and the second facing surfaces, and the front end portions of the clamp arms are formed so that out of edges that construct an outer form of a section perpendicular to a length direction of each clamp arm, a length of a segment that joins both ends of at least one edge out of the edges that correspond to the third facing surfaces is longer than a shortest length out of lengths of the edges that respectively correspond to the first facing surfaces and the second facing surfaces.

Also, with the clamp sensor according to an aspect of this application, the front end portions of the clamp arms are formed so that lengths of all segments that join both ends of the edges that correspond to the third facing surfaces are longer than the shortest length out of lengths of the edges that respectively correspond to the first facing surfaces and the second facing surfaces.

Also, the clamp sensor according to an aspect of this application comprises: a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed, wherein the clamp sensor is capable of detecting a detected value of a clamped object in a state where the clamped object is clamped by the clamp arms, front end portions of the clamp arms have a pair of first facing surfaces that construct an outer circumferential surface and an inner circumferential surface of the ring-shaped body, a pair of second facing surfaces that construct two side surfaces of the ring-shaped body, and a plurality of pairs of third facing surfaces that are inclined with respect to the first facing surfaces and the second facing surfaces, and the front end portions of the clamp arms are formed so that out of edges that construct an outer form of a section perpendicular to a length direction of each clamp arm, an opposing distance between a segment that joins both ends of one edge out of a pair of facing edges that correspond to the third facing surfaces and a segment that joins both ends of another edge in the pair is within a range of over $(100/\sqrt{2})\%$ but no greater than 110% of a shorter distance out of an opposing distance between edges corresponding to the first facing surfaces and an opposing distance between edges corresponding to the second facing surfaces out of the edges.

Also, with the clamp sensor according to an aspect of this application, the front end portions of the clamp arms are formed so that the opposing distance between all combinations of the facing edges is within a range of over $(100/\sqrt{2})\%$ but no greater than 110% of the shorter distance out of the opposing distance between edges corresponding to the first facing surfaces and the opposing distance between edges corresponding to the second facing surfaces.

Also, with the clamp sensor according to an aspect of this application comprises: a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed, wherein the clamp sensor is capable of detecting a detected value of a clamped object in a state where the clamped object is clamped by the clamp arms, front end portions of the clamp arms have a pair of first facing surfaces that construct an outer circumferential surface and an inner circumferential surface of the ring-shaped body, a pair of second facing surfaces that construct two side surfaces of the ring-shaped body, and a plurality of pairs of third facing surfaces that are inclined with respect to the first facing surfaces and the second facing surfaces, and the front end portions of the clamp arms are formed so that out of edges that construct an outer form of a section perpendicular to a length direction of each clamp arm, a length of a segment that joins both ends of at least one edge out of the edges that correspond to the third facing surfaces is within a range of at least 57% but less than 1000% of a shortest length out of lengths of the edges that respectively correspond to the first facing surfaces and the second facing surfaces.

Also, with the clamp sensor according to an aspect of this application, the front end portions of the clamp arms are formed so that lengths of all segments that join both ends of edges out of the edges that correspond to the third facing surfaces are within a range of at least 57% but less than 1000% of a shortest length out of lengths of the edges that respectively correspond to the first facing surfaces and the second facing surfaces.

Also, the clamp sensor according to an aspect of this application comprises: a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed, wherein the clamp sensor is capable of detecting a detected value of a clamped object in a state where the clamped object is clamped by the clamp arms, front end portions of the clamp arms have a pair of first facing surfaces that construct an outer circumferential surface and an inner circumferential surface of the ring-shaped body and a pair of second facing surfaces that construct two side surfaces of the ring-shaped body, and out of edges that construct an outer form of a section perpendicular to a length direction of each clamp arm, edges corresponding to the first facing surfaces are straight and edges corresponding to the second facing surfaces are arc-shaped so as to be outwardly curved.

Also, with the clamp sensor according to an aspect of this application, the front end portions of the clamp arms are formed so that a longest opposing distance between edges corresponding to the second facing surfaces along a direction perpendicular to a plane of an opening in the ring-shaped body is no greater than an opposing distance between edges corresponding to the first opposing distance.

Also, the clamp sensor according to an aspect of this application comprises: a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed, wherein the clamp sensor is capable of detecting a detected value of a clamped object in a state where the clamped object is clamped by the clamp arms, front end portions of the clamp arms have a pair of first facing surfaces that construct an outer circumferential surface and an inner circumferential surface of the ring-shaped body, a pair of second facing surfaces that construct two side surfaces of the ring-shaped body, and two pairs of fourth facing surfaces that are positioned between the first facing surfaces and the second facing surfaces, and the front end portions of the clamp arms are formed so that out of edges that construct an outer form of a section perpendicular to a length direction of each clamp arm, edges corresponding to the first facing surfaces and edges corresponding to the second facing surfaces are straight and edges corresponding to the fourth facing surfaces are arc-shaped so as to be outwardly curved.

Also, with the clamp sensor according to an aspect of this application, the front end portions of the clamp arms are formed so that an opposing distance between the edges corresponding to the second facing surfaces is no greater than an opposing distance between the edges corresponding to the first facing surfaces.

Also, with the clamp sensor according to an aspect of this application, the clamp arms each have a sensor case that constructs an outer shell of the clamp arms, and each sensor case is formed so that a thickness of a part corresponding to a front end of each clamp arm is uniform or substantially uniform when looking from the section.

Also, with the clamp sensor according to an aspect of this application, the clamp arms are formed so that an area of the section at base end portions of the clamp arms is larger than an area of the section at the front end portions.

Also, with the clamp sensor according to an aspect of this application, the clamp arms each include a core in which a magnetic field is produced by a current flowing in the clamped object, a plane that passes any point, which is on a straight line that passes a top end of the ring-shaped body corresponding to the front ends and a centroid in plan view of a ring-shaped magnetic circuit formed by the cores when the ring-shaped body is formed and which is in a range that has a length equivalent to 40% of a straight line distance from the top end to the centroid and is centered on the centroid, and is perpendicular to the straight line is set as a boundary plane, and the clamp arms are formed so that an area of an outer form of the section at parts, as the front end portions, between the boundary plane and the front ends is smaller than an area of an outer form of the section at parts, as the base end portions, between the boundary plane and the base ends.

Also, with the clamp sensor according to an aspect of this application, a plane that passes any point, which is on a straight line that passes a top end of the ring-shaped body corresponding to the front ends and a centroid in plan view of an inner circumference of the ring-shaped body and which is in a range that has a length equivalent to 40% of a straight line distance from the top end to the centroid and is centered on the centroid, and is perpendicular to the straight line is set as a boundary plane, and the clamp arms are formed so that an area of an outer form of the section at parts, as the front end portions, between the boundary plane and the front ends is smaller than an area of an outer form of the section at parts, as the base end portions, between the boundary plane and the base ends.

Also, with the clamp sensor according to an aspect of this application, the clamp arms are formed so that the first facing surfaces that construct the outer circumferential surface at the front ends of the clamp arms produce a single flat surface that is perpendicular to a direction that connects a front end and a base end of the ring-shaped body in a state where the ring-shaped body is formed, and an opposing distance between the first facing surfaces at the front ends is shorter than an opposing distance between the first facing surfaces at other parts of the clamp arms aside from the front ends.

Also, with the clamp sensor according to an aspect of this application, the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

Also, with the clamp sensor according to an aspect of this application, the clamp arms are formed so that a longest distance out of straight line distances between any two points on the outer form of the section in a part between the boundary plane and the front ends is within a range of at least 1/6 but no greater than 1/5 of a separation distance between the front ends of the clamp arms in a state where the front ends are separated by a maximum amount.

Also, the measuring device according to an aspect of this application comprises: the clamp sensor according to an aspect of this application; and a measurer that measures a measured value for the clamped object based on the detected value detected by the clamp sensor.

Advantageous Effects of Invention

According to the clamp sensor according to an aspect of this application claim 1 and the measuring device according to an aspect of this application, the front end portions of the clamp arms are formed so that out of the edges constructing the outer form of the section, the length of a segment that joins both ends of at least one edge corresponding to a third facing surface is longer than a shortest length out of the lengths of the edges respectively corresponding to the first facing surfaces and the second facing surfaces. This means that in this clamp sensor and measuring device, the opposing distance between the edges that correspond to the third facing surfaces can be made shorter than the opposing distance between the edges corresponding to the first facing surfaces and the opposing distance between the edges corresponding to the second facing surfaces. As a result, according to this clamp sensor and measuring device, compared to the conventional configuration in which the outer form of the section at each front end portion of the clamp arms is rectangular and the diagonal distance of the section is longer than the opposing distance between the edges that correspond to the first facing surfaces and the opposing distance between the edges that correspond to the second facing surfaces (that is, a configuration where the corners of a rectangular pillar are not chamfered), it is possible to easily insert the front ends of the clamp arms into narrow gaps in a state where the measuring device is tilted. Accordingly, with this clamp sensor and the measuring device, the conductor that is the clamped object can be reliably clamped, even when another conductor or an obstacle is present in the vicinity of the conductor that is the clamped object.

Also, with the clamp sensor according to an aspect of this application and the measuring device according to an aspect of this application, by forming the front end portions of the clamp arms so that the length of all of the segments that join both ends of edges corresponding to the third facing surfaces is longer than the length of the shortest length out of the lengths of the edges respectively corresponding to the first facing surfaces and the second facing surfaces, it is possible to make both of the opposing distances between edges that correspond to opposing distances between edges that correspond to the third facing surfaces shorter than the opposing distance between the edges that correspond to the first facing surfaces and the opposing distance between the edges that correspond to the second facing surfaces. This means that even when the measuring device is tilted so as to rotate in either of the clockwise or counterclockwise directions with the length direction of the measuring device as the rotational axis for example, it is possible to easily insert the front ends of the clamp arms into narrow gaps.

Also, according to the clamp sensor according to an aspect of this application and the measuring device according to an aspect of this application, the front end portions of the clamp arms are formed so that out of the edges that construct the outer form of the section, the opposing distance between a segment that joins both ends of one edge out of edges corresponding to third facing surfaces and a segment that joins both ends of the other edge is within a range of over $(100/\sqrt{2})\%$ but no greater than 110% of a shorter distance out of the opposing distance between the edges corresponding to the first facing surfaces and the opposing distance between the edges corresponding to the second facing surfaces out of the edges. This means that with this clamp sensor and the measuring device, the opposing distance corresponding to the third facing surfaces can be made sufficiently shorter than the diagonal distance of a section in a conventional configuration formed so that the outer form of the section at the front end portions of the clamp arms is rectangular (a configuration where the corners of a rectangular pillar are not chamfered). As a result, with this clamp sensor and the measuring device, compared to the conventional configuration, the front ends of the clamp arms can be easily inserted into narrow gaps in a state where the measuring device is tilted. Accordingly, with this clamp sensor and the measuring device, the conductor that is the clamped object can be reliably clamped, even when for example another conductor or an obstacle is present in the vicinity of the conductor that is the clamped object.

Also, according to the clamp sensor according to an aspect of this application and the measuring device according to an aspect of this application, by forming the front end portions of the clamp arms so that the opposing distance for every combination of the facing edges is within a range of over $(100/\sqrt{2})\%$ but no greater than 110% of the shorter distance out of the opposing distance between the edges corresponding to the first facing surfaces and the opposing distance between the edges corresponding to the second facing surfaces, it is possible to make all of the opposing distances corresponding to the third facing surfaces sufficiently shorter than the diagonal distance of the section in the conventional configuration. This means that with this clamp sensor and the measuring device, the front ends of the clamp arms can be easily inserted into narrow gaps, even in a state where for example the measuring device is tilted so as to rotate in either the clockwise or counterclockwise direction with the length direction of the measuring device as the rotational axis.

Also, according to the clamp sensor according to an aspect of this application and the measuring device according to an aspect of this application, out of the edges that construct the outer form of the section, the length of a segment that joins both ends of at least one edge corresponding to the third facing surfaces is within a range of at least 57% but less than 1000% of a shortest length out of the lengths of the edges respectively corresponding to the first facing surfaces and the second facing surfaces. This means that according to this clamp sensor and the measuring device, it is possible to make the opposing distance between the edges corresponding to third facing surfaces sufficiently shorter than the diagonal distance of the section in the conventional configuration where the outer form of a section at front end portions of the clamp arms is rectangular (a configuration where corners of a rectangular pillar are not chamfered). As a result, according to this clamp sensor and the measuring device, compared to the conventional configuration, it is possible to easily insert the front ends of the clamp arms into narrow gaps in a state where the measuring device is tilted. Accordingly, with this clamp sensor and the measuring device, even if another conductor or an obstacle is present in the vicinity of the conductor that is the clamped object, it is still possible to reliably clamp the conductor that is the clamped object.

Also, according to the clamp sensor according to an aspect of this application and the measuring device according to an aspect of this application, by forming the front end portions of the clamp arms so that lengths of all segments that join both ends of edges out of the edges corresponding to the third facing surfaces are within a range of at least 57% but less than 1000% of a shortest length out of the lengths of the edges respectively corresponding to the first facing surfaces and the second facing surfaces, it is possible to make all of the opposing distances between the edges corresponding to the third facing surfaces sufficiently shorter than the diagonal distance of the section in the conventional configuration. This means that according to this clamp sensor and the measuring device, the front ends of the clamp arms can be easily inserted into narrow gaps, even in a state where for example the measuring device is tilted so as to rotate in either the clockwise or counterclockwise direction with the length direction of the measuring device as the rotational axis.

Also, according to the clamp sensor according to an aspect of this application and the measuring device according to an aspect of this application, by forming the front end portions of the clamp arms so that out of the edges that construct the outer form of the section, the edges corresponding to the first facing surfaces are straight and the edges corresponding to the second facing surfaces are arc-shaped so as to be outwardly curved, it is possible to make the longest opposing distance between edges corresponding to the second facing surfaces no greater than the opposing distance between edges corresponding to the first facing surfaces. This means that compared to the conventional configuration in which the outer form of the section at each front end portion of the clamp arms is rectangular and the diagonal distance of the section is longer than the opposing distance between the edges that correspond to the first facing surfaces and a longest opposing distance between the edges that correspond to the second facing surfaces (that is, a configuration where the corners of a rectangular pillar are not chamfered), it is possible to easily insert the front ends of the clamp arms into narrow gaps in a state where the measuring device is tilted. Accordingly, with this clamp sensor and the measuring device, even if another conductor or an obstacle is present in the vicinity of the conductor that is the clamped object, it is still possible to reliably clamp the conductor that is the clamped object.

Also, according to the clamp sensor according to an aspect of this application and the measuring device according to an aspect of this application, the front end portions of the clamp arms are formed so that the longest opposing distance between edges corresponding to the second facing surfaces along a direction perpendicular to a plane of an opening in the ring-shaped body is no greater than an opposing distance between edges corresponding to the first facing surfaces. Accordingly, with this clamp sensor and the measuring device, by tilting the measuring device so as to reduce the angle of inclination of the plane of the opening in the ring-shaped body relative to the direction in which the conductor that is the clamped object extends, it is possible to insert the front ends of the clamp arms into narrow gaps even more easily.

Also, according to the clamp sensor according to an aspect of this application and the measuring device according to an aspect of this application, by forming the front end portions of the clamp arms so that out of the edges that construct the outer form of the section, the edges corresponding to the first facing surfaces and the edges corresponding to the second facing surfaces are straight and the edges corresponding to the fourth facing surfaces are arc-shaped so as to be outwardly curved, it is possible to make the longest opposing distance between the edges corresponding to the fourth facing surfaces no greater than the opposing distance between the edges corresponding to the first facing surfaces. This means that compared to a conventional configuration (a configuration where the corners of a rectangular pillar are not chamfered) where the outer form of the section at each front end portion of the clamp arms is rectangular and the diagonal distance of the section is formed so as to be longer than the opposing distance between the edges corresponding to the first facing surfaces and the opposing distance between the edges corresponding to the second facing surfaces, it is possible to easily insert the front ends of the clamp arms into narrow gaps in a state where the measuring device is tilted. This means that according to the clamp sensor and the measuring device, even when another conductor or an obstacle is present in the vicinity of the conductor that is the clamped object, it is possible to reliably clamp the conductor that is the clamped object.

Also, according to the clamp sensor according to an aspect of this application and the measuring device according to an aspect of this application, the front end portions of the clamp arms are formed so that the opposing distance between the edges corresponding to the second facing surfaces is no greater than the opposing distance between the edges corresponding to the first facing surfaces. This means that according to the clamp sensor and the measuring device, by tilting the measuring device so as to reduce the angle of inclination of the plane of the opening in the ring-shaped body relative to the direction in which the conductor that is the clamped object extends, it is possible to insert the front ends of the clamp arms into narrow gaps even more easily.

Also, with the clamp sensor according to an aspect of this application and the measuring device according to an aspect of this application, the clamp arms are formed so that the thickness of the part corresponding to the front end of each sensor case that constructs the outer shells of the clamp arms is uniform (or substantially uniform) when viewed at the section. This means that according to the clamp sensor and the measuring device, compared to a configuration where the thickness of each sensor case is non-uniform, it is possible to avoid concentration of stress in parts of the sensor cases where the thickness is low and to increase the strength of the sensor cases. It is therefore possible to reliably avoid damage to the sensor cases when a load is applied to the sensor cases.

Also, according to the clamp sensor according to an aspect of this application and the measuring device according to an aspect of this application, by forming the clamp arms so that the area of the section at the base end portions of the clamp arms is larger than the area of the section at the front end portions, compared to a configuration where the clamp arms are formed so that the area of the section at the front end portions and the area of the section at the base end portions are the same, it is possible to sufficiently increase the strength of the clamp arms.

Also, with the clamp sensor according to an aspect of this application and the measuring device according to an aspect of this application, the clamp arms are formed so that the area of the outer form of the section at parts between the front ends and the boundary plane, which is perpendicular to the straight line (which passes the top end of the ring-shaped body and the centroid in plan view of the magnetic circuit) and passes a point in a range on the straight line that is centered on the centroid and has a length equivalent to 40% of the straight line distance from the top end to the centroid, is smaller than the area of the outer form of the section at parts between the boundary plane and the base ends. Here, when a plane that passes through a point that is close to the top end and is beyond the range of the length equivalent to 40% is defined as the boundary plane, the length of the front end portions whose area is small (that is, are narrow) is reduced, and when clamping one out of a large number of clamped objects disposed so as to be aligned side by side at narrow intervals, it is difficult to insert the front ends of the clamp arms deeply into the narrow gaps between the adjacent clamped objects. On the other hand, when a plane that passes through a point that is close to the base end and is beyond the range of the length equivalent to 40% is defined as the boundary plane, the length of the base end portions whose area is large (that is, are thick) is reduced, which lowers the strength of the clamp arms. Conversely, in this clamp sensor and the measuring device, since a plane that passes through the point defined within the range of the length equivalent to 40% is defined as the boundary plane, it is possible to easily insert the front ends of the clamp arms deeply into the narrow gaps between the adjacent clamped objects without reducing the strength of the clamp arms. Accordingly, by using the clamp sensor and the measuring device, the clamped object can be reliably clamped.

Also, with the clamp sensor according to an aspect of this application and the measuring device according to an aspect of this application, the clamp arms are formed so that the area of the outer form of the section at parts between the front ends and the boundary plane, which is perpendicular to the straight line (which passes the top end of the ring-shaped body and the centroid in plan view of the inner circumference of the ring-shaped body) and passes a point in a range on the straight line that is centered on the centroid and has a length equivalent to 40% of the straight line distance from the top end to the centroid, is smaller than the area of the outer form of the section at parts between the boundary plane and the base ends. Here, when a plane that passes through a point that is close to the top end and is beyond the range of the length equivalent to 40% is defined as the boundary plane, the length of the front end portions whose area is small (that is, are narrow) is reduced, and when clamping one out of a large number of clamped objects disposed so as to be aligned side by side at narrow intervals, it is difficult to insert the front ends of the clamp arms deeply into the narrow gaps between the adjacent clamped objects. On the other hand, when a plane that passes through a point that is close to the base end and is beyond the range of the length equivalent to 40% is defined as the boundary plane, the length of the base end portions whose area is large (that is, are thick) is reduced, which lowers the strength of the clamp arms. Conversely, in this clamp sensor and the measuring device, since a plane that passes through the point defined within the range of the length equivalent to 40% is defined as the boundary plane, it is possible to easily insert the front ends of the clamp arms deeply into the narrow gaps between the adjacent clamped objects without reducing the strength of the clamp arms. Accordingly, by using the clamp sensor and the measuring device, the clamped object can be reliably clamped.

Also, with the clamp sensor according to an aspect of this application and the measuring device according to an aspect of this application, the clamp arms are formed so that the first facing surfaces that construct the outer circumferential surface of the ring-shaped body at the front ends of the clamp arms are formed so as to produce a single flat surface that is perpendicular to a direction that connects the top end and the base end of the ring-shaped body in the state where the ring-shaped body is formed and the opposing distance between the first facing surfaces at the front ends is shorter than the opposing distance between the first facing surfaces at other parts of the clamp arms aside from the front ends. This means that according to the clamp sensor and the measuring device, the front ends of the clamp arms can be inserted even more easily into narrow gaps. Also, since the opposing distance between the first facing surfaces at the front ends is short, even when an obstacle such as a wall is present behind the clamped object and the gap between the clamped object and the obstacle is narrow, it is still possible to reliably clamp the clamped object while avoiding contact between the obstacle and the clamp arms.

Also, in the clamp sensor according to an aspect of this application and the measuring device according to an aspect of this application, the clamp arms are formed so that the length along the straight line between the outer circumferential surface of the ring-shaped body and the position that is 15 mm from the center of the top end along a direction that is perpendicular to the straight line, which passes the top end of the ring-shaped body and the centroid, and parallel to the plane of the opening in the ring-shaped body, is within a range of at least 9 mm but no greater than 11 mm. Here, when the clamp arms are formed so that the above-described length exceeds 11 mm, the shape of the front end side of the clamp arms is too slender, so that as one example, when a clamed object disposed in the vicinity of a wall surface is to be clamped by the clamp arms, there is the risk of the front ends of the clamp arms contacting the wall surface, which makes clamping difficult. Also, when the clamp arms are formed so that the above-described length exceeds 11 mm, the top end side of the ring-shaped body will become extremely slender and the detection characteristics for the detected value may deteriorate. On the other hand, when the clamp arms are formed so that the above-described length is less than 9 mm, the shape of the front end side of the clamp arms will be close to an arc shape, and when attempting, for example, to clamp one out of a plurality of clamped objects disposed close to each other with the clamp arms, it is difficult to insert the front ends into gaps between other adjacent clamped objects, which makes clamping difficult. Conversely, with the clamp sensor and the measuring device, by forming the clamp arms so that the above-described length is within the range of at least 9 mm but no greater than 11 mm, it is possible to reliably clamp the clamped object while favorably maintaining the detection characteristics for magnetic fields.

Also, with the clamp sensor according to an aspect of this application and the measuring device according to an aspect of this application, the clamp arms are formed so that the longest distance between any two points on the outer form of the section in a part between the boundary plane and the front ends is within a range of at least 1/6 but no greater than 1/5 of the separation distance between the front ends of the clamp arms in a state where the front ends are separated by the maximum amount. Here, if the clamp arms are formed so that the above-described ratio exceeds 1/5, when clamping one out of a large number of clamped objects disposed side by side at narrow intervals, it is difficult to insert the front ends of the clamp arms into the narrow gaps between the adjacent clamped objects. On the other hand, when the clamp arms are formed so that the above-described ratio is less than 1/6, the separation distance in a state where the lever, which opens the clam arms (i.e., separates the front ends), is pressed in by the maximum amount and the front ends are separated by the maximum amount is too long, so that when a large number of clamped objects are disposed side by side at narrow intervals, there is the risk that a plurality of the clamped objects will be clamped. This may make it necessary for the user to vary how hard the lever is pressed, which results in poor operability. Conversely, with this clamp sensor and the measuring device, by forming the clamp arms so that the opposing distance is within the range of at least 1/6 but no greater than 1/5 of the separation distance, it is possible to easily insert the front ends into the narrow gaps between adjacent clamped objects in a state where the lever has been pressed in by the maximum amount. This means that while sufficiently improving operability, it is possible to clamp one out of a plurality of the clamped objects even more reliably.

BRIEF DESCRIPTION OF DRAWINGS

FIG. 11 is a second diagram useful in explaining a method of using the clamp meter 1.

DESCRIPTION OF EMBODIMENTS

Preferred embodiments of a clamp sensor and a measuring device will now be described with reference to the attached drawings.

Figure 10:
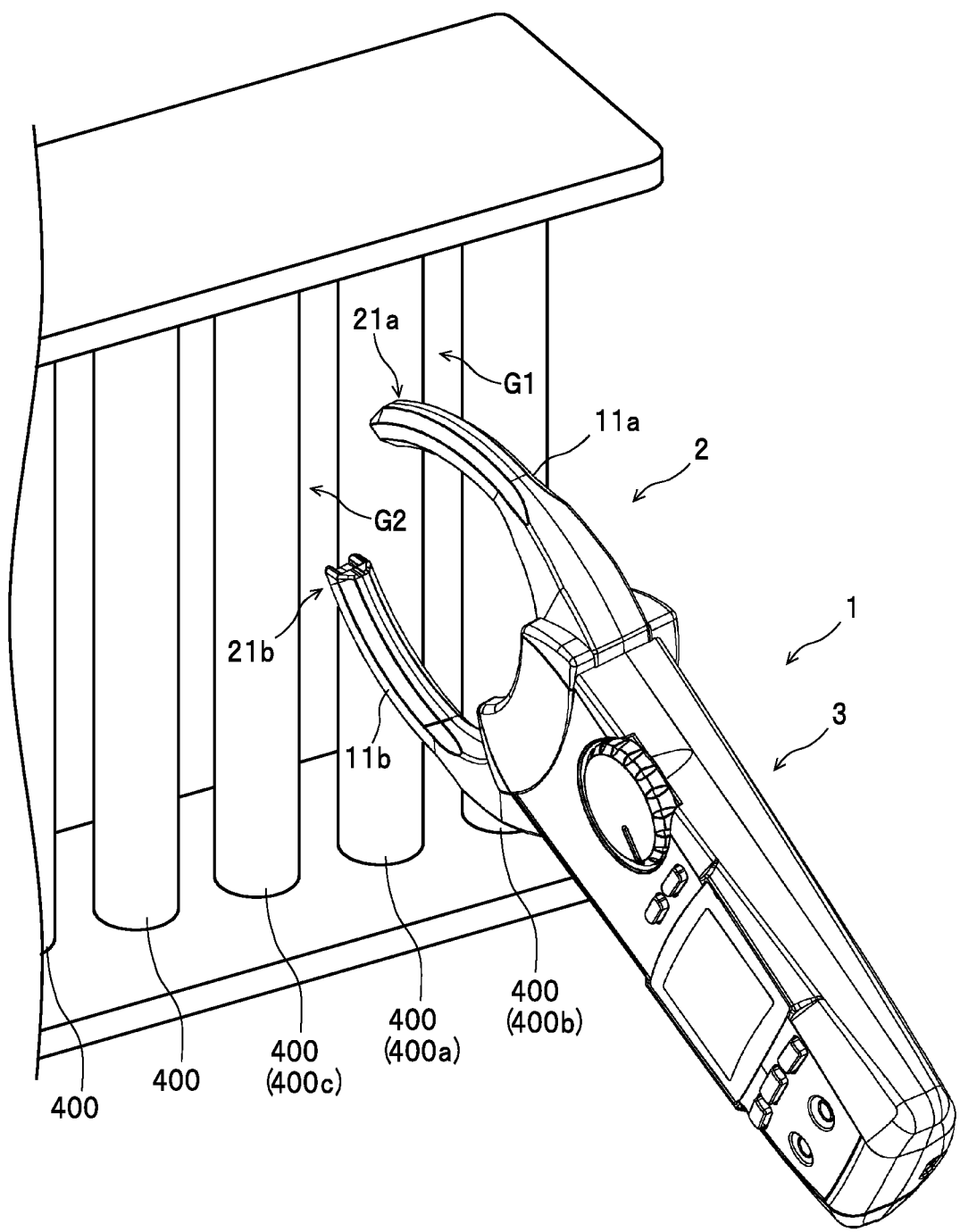
FIG. 10 is a first diagram useful in explaining a method of using the clamp meter 1.

First, the configuration of a clamp meter 1 depicted in FIG. 1 will be described. The clamp meter 1 is one example of a measuring device, and is configured so as to be capable of contactlessly (i.e., without metal-metal contact) measuring the current (one example of a "measured value") flowing in a conductor 400 as one example of a clamped object, which is depicted in FIG. 10. In more detail, as depicted in FIGS. 1 to 3, the clamp meter 1 is equipped with a clamp sensor 2 and a main body 3.

Figure 1:
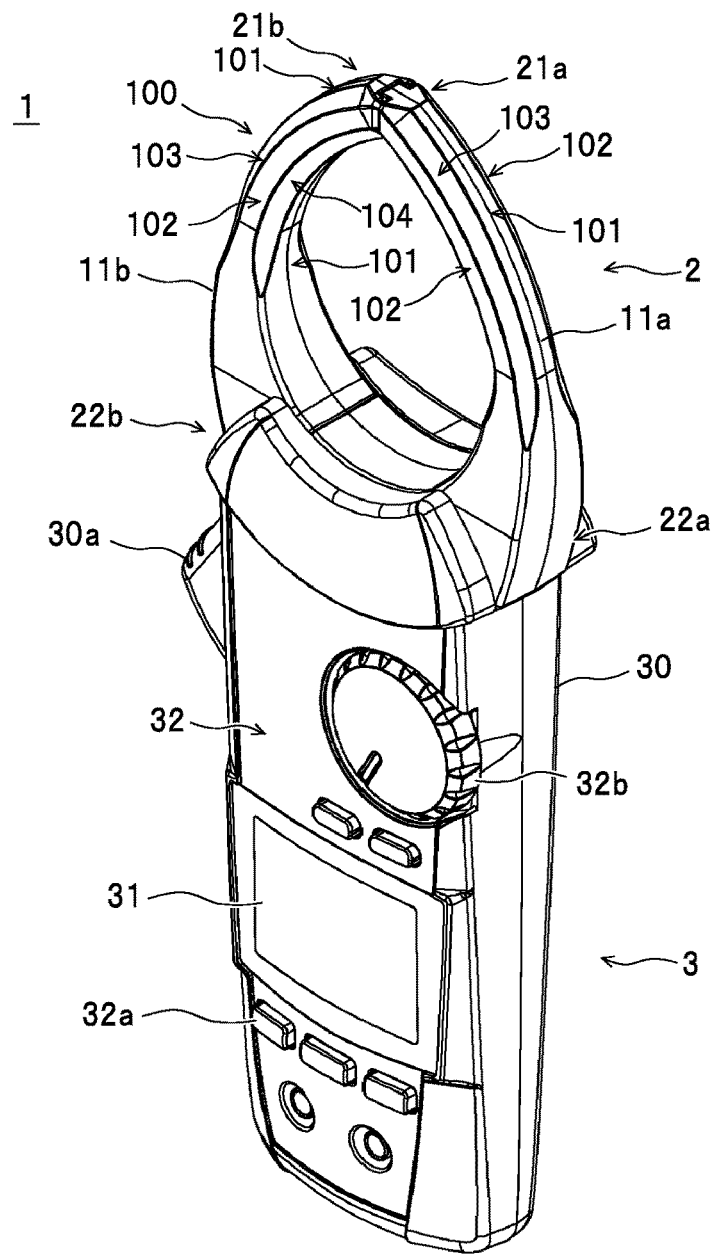
FIG. 1 is a perspective view of a clamp meter 1.
Figure 2:
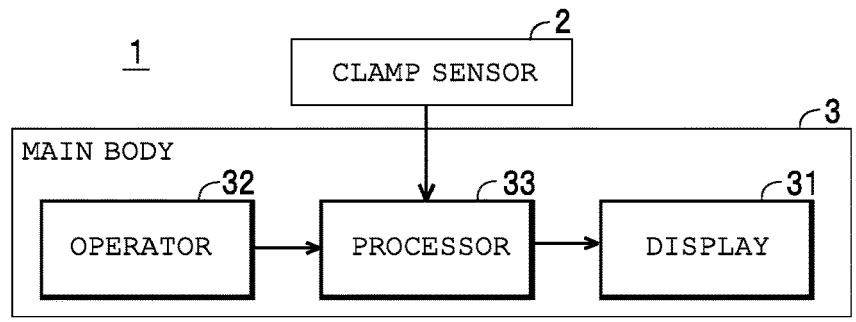
FIG. 2 is a block diagram depicting the configuration of the clamp meter 1.
Figure 3:
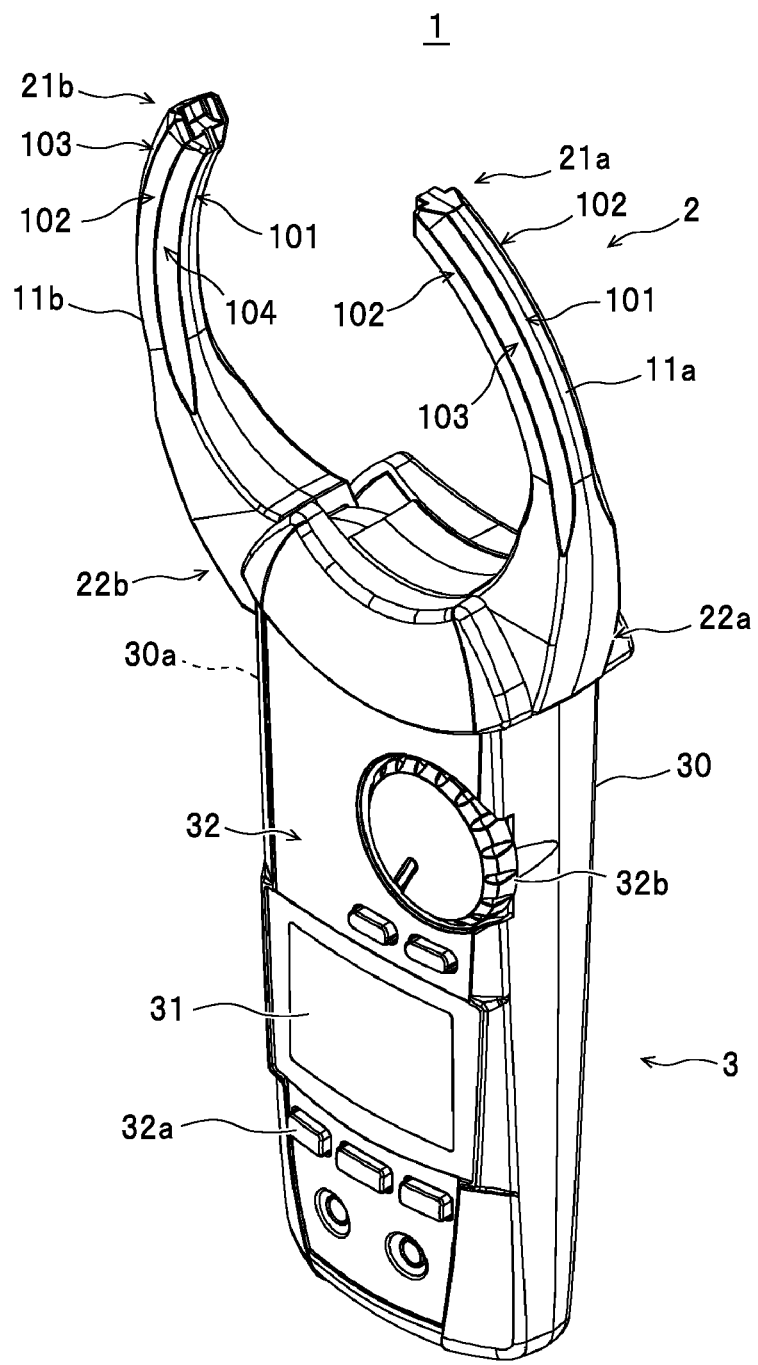
FIG. 3 is a perspective view of the clamp meter 1 when a clamp sensor 2 is in an opened state.
Figure 4:
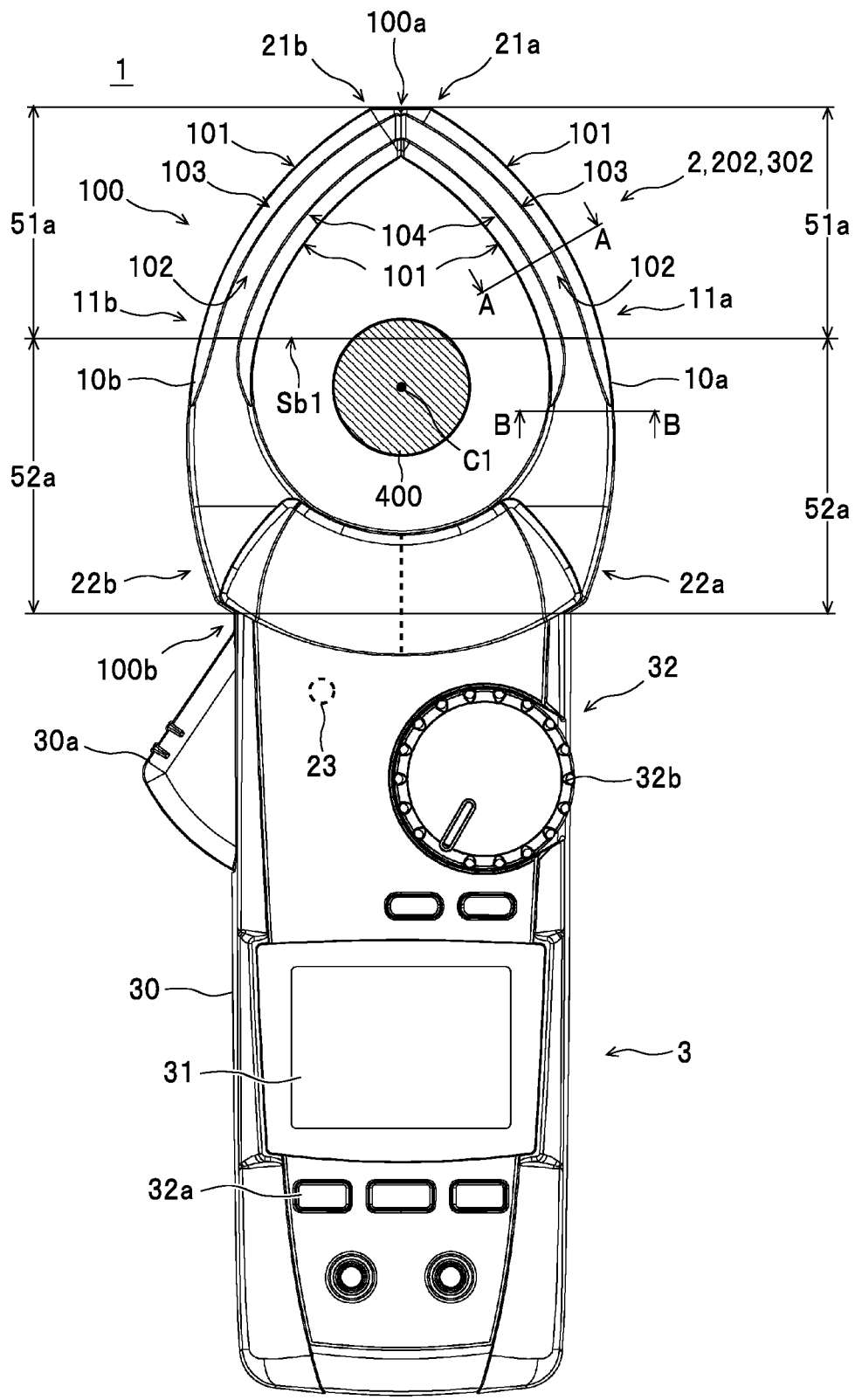
FIG. 4 is a front view of the clamp meter 1.

As depicted in FIGS. 1 and 3, the clamp sensor 2 includes a pair of clamp arms 11a and 11b (hereinafter, collectively referred to as the "clamp arms 11" when no distinction is made between them), and as depicted in FIG. 4, in a state where the conductor 400 is clamped by (that is, surrounded by) the clamp arms 11a and 11b, a magnetic field is contactlessly detected as a detected value produced when a current flows in the conductor 400.

Also, with this clamp sensor 2, as depicted in FIGS. 1 and 3, the clamp arm 11b (which is one of the clamp arms 11a and 11b) is configured so as to be rotatable about a rotational shaft 23 (see FIG. 4) so that front ends 21a and 21b of the clamp arms 11a and 11b open and close (i.e., come in to contact and move apart). The clamp arm 11a is fixed to a main body case 30 of the main body 3 in a non-rotatable state. The clamp sensor 2 is also configured so that the clamp arm 11b rotates in response to operations (pressing, or the releasing of pressing) of a lever 30a disposed on the main body case 30. Note that in the following description, a state where the front ends 21a and 21b of the clamp arms 11a and 11b are closed (the state depicted in FIG. 1) is referred to as the "closed state" and a state where the front ends 21a and 21b have been opened (the state depicted in FIGS. 3 and 9) is referred to as the "opened state".

As depicted in FIG. 4, the clamp arm 11a includes a sensor case 10a, a core 41 (see FIGS. 5 and 7) housed inside the sensor case 10a, and a magnetic detection element (as one example, a Hall element), not illustrated. As depicted in FIG. 4, the clamp arm 11b includes a sensor case 10b and a core 41 (see FIGS. 5 and 7) housed inside the sensor case 10b.

As depicted in FIG. 4, the clamp arms 11a and 11b are both formed so as to be substantially arc-shaped in plan view, that is, when looking in the thickness direction (which is the axial direction of the rotational shaft 23), so as to form a ring-shaped body 100 when the front ends 21a and 21b are closed. Here, as depicted in the drawings, an inner circumferential surface on a base end 100b side of the ring-shaped body 100 is formed in a semicircular shape in plan view by parts on the respective base ends 22a and 22b sides of the clamp arms 11a and 11b (these parts are hereinafter also referred to as the "base end portions 52a and 52b") and a top end 100a (that is, parts corresponding to the front ends 21a and 21b) side of the ring-shaped body 100 is formed as a slender ring-shape that is arc-shaped in plan view by parts on the front ends 21a and 21b sides of the clamp arms 11a and 11b (hereinafter, these parts are also referred to as the "front end portions 51a and 51b"). The inner circumferential surface on the top end 100a side also has a smaller curvature (that is, a larger radius of curvature) than the inner circumferential surface on the base end 100b side.

Figure 5:
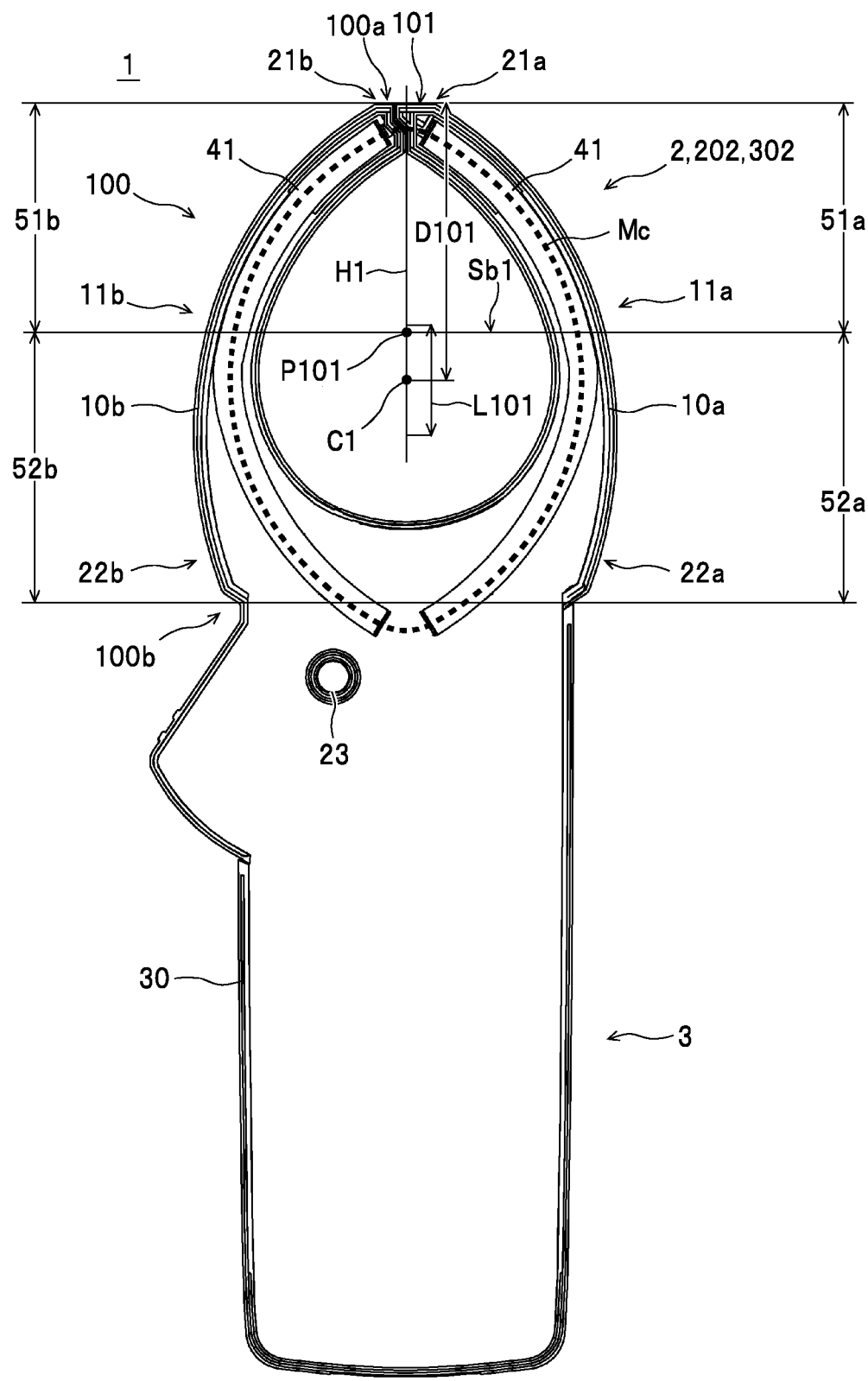
FIG. 5 is a schematic front view of the clamp meter 1 in a state where sensor cases 10a and 10b, part of a main body case 30, and the like have been removed.

As depicted in FIG. 5, in the state where the ring-shaped body 100 is formed, the cores 41 of the clamp arms 11a and 11b form a ring-shaped (that is, substantially oval) magnetic circuit Mc. In this state, when a current flows in the conductor 400 surrounded (or "clamped") by the clamp arms 11a and 11b, the current produces a magnetic field in the magnetic circuit Mc, which is detected by the magnetic detection element in the clamp arm 11a.

Figure 6:
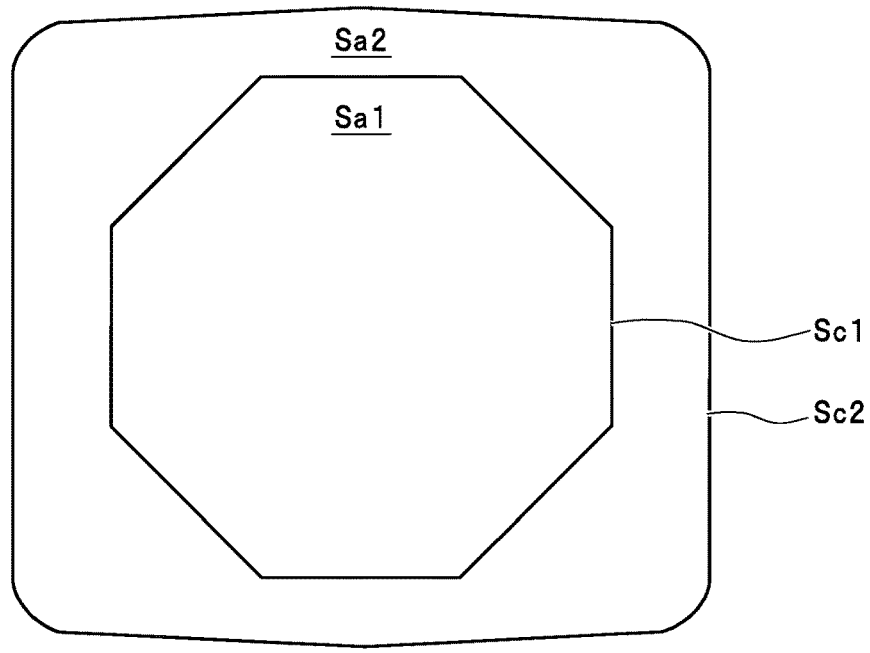
FIG. 6 is a cross-sectional view that compares a section along a line A-A and a section along a line B-B in FIG. 4.

As depicted in FIG. 6, the clamp arms 11a and 11b are formed so that the outer form of a section Sc1 (as on example, the cross section along the line A-A in FIG. 4) of the front end portions 51a and 51b taken perpendicular to the length direction is substantially octagonal, for example, and the outer form of a section Sc2 (for example, a cross section taken along the line B-B in FIG. 4) of the base end portions 52a and 52b taken perpendicular to the length direction is substantially rectangular. In addition, as depicted in FIG. 6, the clamp arms 11a and 11b are formed so that the area Sa1 of the outer form of the section Sc1 at the front end portions 51a and 51b is smaller than the area Sa2 (hereinafter, when no distinction is made between the areas Sa1 and Sa2, the expression "area Sa" is used) of the outer form of the section Sc2 at the base end portions 52a and 52b, that is, so that the area Sa2 is larger than the area Sa1. In other words, the clamp arms 11a and 11b are formed so that the front end portions 51a and 51b are thinner than the base end portions 52a and 52b.

In this the clamp sensor 2, the front end portions 51a and 51b and the base end portions 52a and 52b are defined as follows. First, as depicted in FIG. 5, a straight line H1 that passes the top end 100a of the ring-shaped body 100 and a centroid C1 in plan view (depicted by the dotted lines in FIG. 5) of the magnetic circuit Mc formed by the cores 41 is defined. Next, a length L101 equivalent to 40% of a distance D101 (the straight line distance) from the top end 100a (in more detail, an outer facing surface 101 at the top end 100a) to the centroid C1 is specified, and any point (hereinafter, also referred to the "defined point P101") is defined on the straight line H1 in a range that is centered on the centroid C1 and has the length L101. Here, in this example, a point separated from the centroid C1 toward the top end 100a by a length corresponding to 17% of the distance D101 is defined as the "defined point P101". After this, a plane that passes through the defined point P101 and is perpendicular to the straight line H1 is defined as a "boundary plane Sb1", the parts between the boundary plane Sb1 and the front ends 21a and 21b of the clamp arms 11a and 11b are defined as the "front end portions 51a and 51b" and the parts between the boundary plane Sb1 and the base ends 22a and 22b are defined as the "base end portions 52a and 52b".

Figure 7:
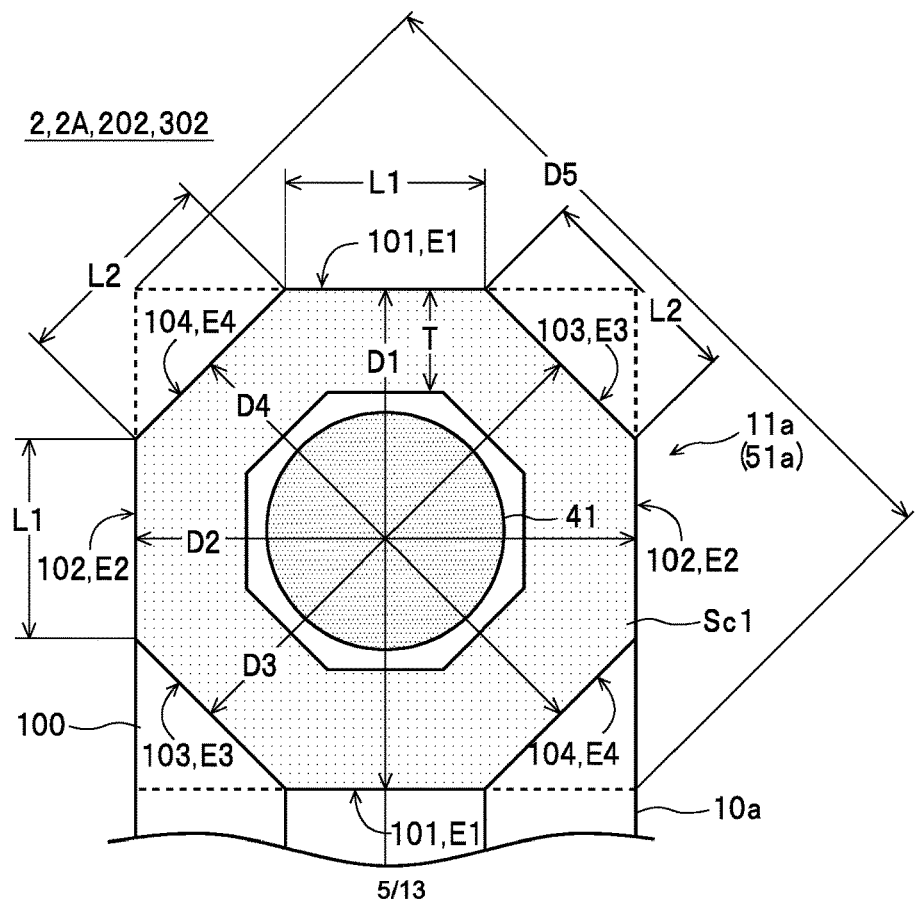
FIG. 7 is a cross-sectional view along the line A-A in FIG. 4.

As depicted in FIGS. 1, 3, and 4, the front end portions 51a and 51b of the clamp arms 11a and 11b have a pair of facing surfaces 101 that construct the outer circumferential surface and the inner circumferential surface of the ring-shaped body 100 (and correspond to "first facing surfaces"), a pair of facing surfaces 102 that construct two side surfaces of the ring-shaped body 100 (and correspond to "second facing surfaces"), and a pair of facing surfaces 103 and a pair of facing surfaces 104 that are inclined to the facing surfaces 101 and 102 (both correspond to "third facing surfaces" and in total are two pairs of "third facing surfaces" as one example of a "plurality of pairs"). As depicted in FIG. 7, the front end portions 51a and 51b are formed so that the outer form of the section Sc1 (the cross section along the line A-A in FIG. 4) taken perpendicular to the length direction of the clamp arms 11a and 11b is octagonal or substantially octagonal. In other words, the front end portions 51a and 51b of the clamp arms 11a and 11b are formed as octagonal pillars where the corners of a rectangular pillar depicted by the broken lines in FIG. 7 have been chamfered (the facing surfaces 103 and 104 correspond to surfaces (chamfered surfaces) formed by chamfering). Note that since the front end portions 51a and 51b have the same cross-sectional form, in FIG. 7, only the cross-sectional form of the front end portion 51a is illustrated and the cross-sectional form of the front end portion 51b is omitted.

In this clamp sensor 2, as depicted in FIG. 7, parts of the front end portions 51a and 51b of the clamp arms 11a and 11b aside from the front ends 21a and 21b are formed so that out of the edges of the octagon that is the outer form of the section Sc1, the edges E1 corresponding to the facing surfaces 101 and the edges E2 corresponding to the facing surfaces 102 are formed with the same length L1, and the length of the edges E3 corresponding to the facing surfaces 103 (that is, the length of a segment that joins both ends of an edge E3) and the length of the edges E4 corresponding to the facing surfaces 104 (that is, the length of a segment that joins both ends of an edge E4) are formed with the same length L2. In addition, in the clamp sensor 2, as depicted in FIG. 7, the front end portions 51a and 51b are formed so that the length L2 is longer than the length L1 (the shortest length out of the lengths of the edges E1 and E2).

Note that in the example depicted in FIG. 7, since the edges E3 and E4 are both straight, the lengths of the segments that join both ends of the edges E3 and E4 are the same as the edges E3 and E4. However, it is also possible to use a configuration where the edges E3 and E4 are curved (arc-shaped) (a configuration where the outer form of the section Sc1 is substantially octagonal), and for this configuration, the length of a segment that joins both ends of the edges E3 and E4 is treated as the length L2 and the front end portions 51a and 51b are formed so that the length L2 is longer than the length L1 (the shortest length out of the lengths of the edges E1 and E2).

In this clamp sensor 2, by defining the length L1 of the edges E1 and E2 and the length L2 of the edges E3 and E4 as described above, as depicted in FIG. 7, the front end portions 51a and 51b are formed so that an opposing distance D3 between the edges E3 and an opposing distance D4 between the edges E4 are shorter than an opposing distance D1 between the edges E1 and an opposing distance D2 between the edges E2.

In this clamp sensor 2, as depicted in FIG. 7, the sensor cases 10a and 10b that construct outer shells of the clamp arms 11a and 11b are formed so that the thickness T of parts corresponding to the front end portions 51a and 51b (hereinafter, referred to as "front end parts of the sensor cases 10a and 10b") is uniform (or substantially uniform) when viewed at the section Sc1.

Figure 8:
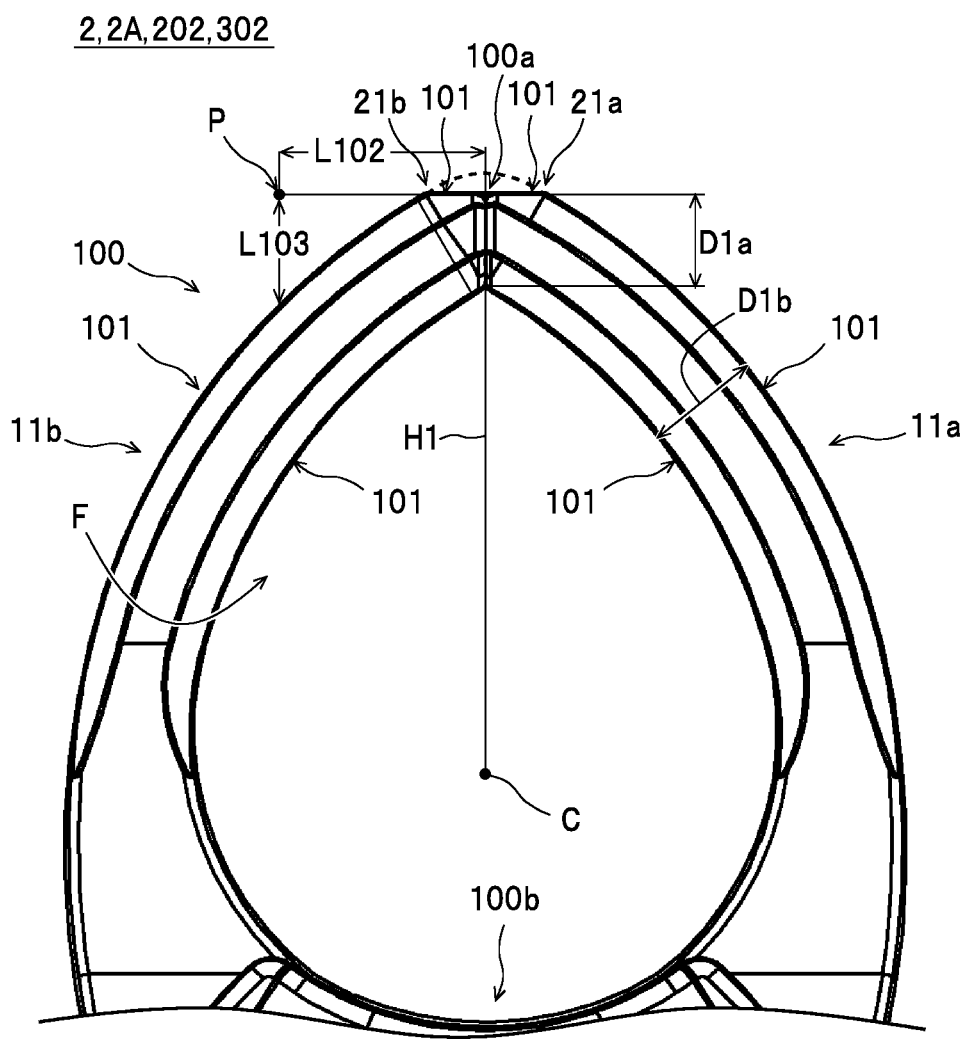
FIG. 8 is a diagram useful in explaining the configuration of clamp arms 11a and 11b.

In this clamp sensor 2, as depicted in FIG. 8, the facing surfaces 101 on the outer circumferential sides of the front ends 21a and 21b of the clamp arms 11a and 11b (that is, the facing surfaces 101 that construct the outer circumferential surface of the ring-shaped body 100) are formed so as to produce a single flat surface that is perpendicular to a direction (the vertical direction in FIG. 8) that connects the top end 100a and the base end 100b in the state where the ring-shaped body 100 is formed. That is, one part of the outer circumference (the portion indicated by the broken line in FIG. 8) of the top end 100a of the ring-shaped body 100 is cut away on a flat plane. By forming the clamp sensor 2 in this way, as depicted in FIG. 8, the clamp arms 11a and 11b are formed so that the opposing distance D1 between the facing surfaces 101 at the front ends 21a and 21b (hereinafter, this particular opposing distance D1 is also referred to as the "opposing distance D1a") is shorter than the opposing distance D1 between the facing surfaces 101 at other parts of the clamp arms 11a and 11b aside from the front ends 21a and 21b (hereinafter, that opposing distance D1 is also referred to as the "opposing distance D1b"). This means that for this clamp sensor 2, the length of the ring-shaped body 100 along the direction that connects the top end 100a and the base end 100b is shorter by the reduction in the opposing distance D1a between the facing surfaces 101 at the front ends 21a and 21b.

Also, in this clamp sensor 2, as depicted in FIG. 8, the clamp arms 11a and 11b are formed so that a length L103 along the straight line H1 between the outer facing surface 101 of the ring-shaped body 100 and a position P that is 15 mm (hereinafter, this length is also referred to as "the length L102") from the center of the top end 100a along a direction that is perpendicular to the straight line H1 described above and parallel to the plane of the opening F in the ring-shaped body 100 is within a range of at least 9 mm but no greater than 11 mm. That is, the clamp arms 11a and 11b are formed so that the ratio of the length L103 to the length L102 is within a range of at least 9/15 but no greater than 11/15.

Here, as one example, when the clamp arms 11a and 11b are formed so that the length L103 exceeds 11 mm, the shape of the front ends 21a and 21b sides of the clamp arms 11a and 11b is too slender, so that as one example, when a conductor 400 disposed in the vicinity of a wall surface (that is, a wall surface is present to the rear) is to be clamped by the clamp arms 11a and 11b, there is the risk of the front ends 21a and 21b of the clamp arms 11a and 11b contacting the wall surface, which makes clamping difficult. Also, when the clamp arms 11a and 11b are formed so that the length L103 exceeds 11 mm, the top end 100a of the ring-shaped body 100 will become extremely slender and the detection characteristics for magnetic fields (the detected value) may deteriorate. On the other hand, when the clamp arms 11a and 11b are formed so that the length L103 is less than 9 mm, the shape of the front ends 21a and 21b sides of the clamp arms 11a and 11b will be close to an arc shape, and when attempting, for example, to clamp one conductor 400 out of a plurality of conductors 400 disposed close to each other with the clamp arms 11a and 11b, it is difficult to insert the front ends 21a and 21b into gaps between other adjacent conductors 400, which makes clamping difficult. Conversely, with the clamp sensor 2, by forming the clamp arms 11a and 11b so that the length L103 along the straight line H1 between the outer facing surface 101 of the ring-shaped body 100 and the position P that is 15 mm from the center of the top end 100a along a direction that is perpendicular to the straight line H1 and parallel to the plane of the opening F in the ring-shaped body 100 is within the range of at least 9 mm but no greater than 11 mm, it becomes possible to reliably clamp a conductor 400 while favorably maintaining the detection characteristics for magnetic fields.

Figure 9:
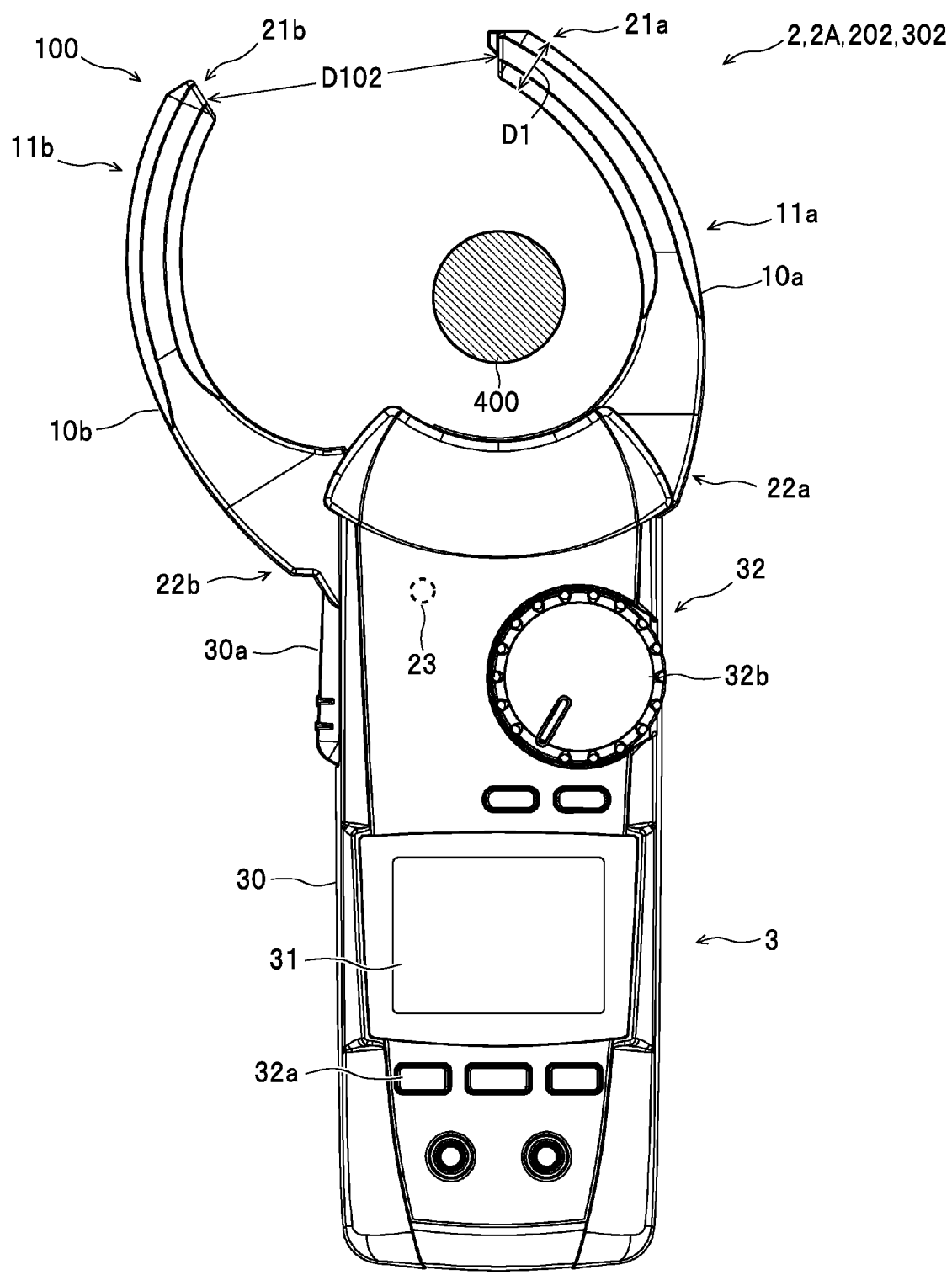
FIG. 9 is a front view of the clamp meter 1 in a state where the clamp arms 11a and 11b are in the opened state.

Also, with the clamp sensor 2, as depicted in FIG. 9, the clamp arms 11a and 11b are formed so that when the longest distance out of straight line distances between any two points on the outer form of the section Sc1 at the front end portions 51a and 51b is set as the opposing distance D1 (see FIG. 7) and a distance between the front ends 21a and 21b of the clamp arms 11a and 11b in a state where the front ends 21a and 21b are separated by the maximum amount is set as the separation distance D102, the ratio R of the opposing distance D1 to the separation distance D102 is within a range of at least 1/6 but no greater than 1/5. Note that for this clamp sensor 2, as one example, the separation distance D102 is defined within a range of 56.8 mm±25%, and the opposing distance D1 is defined within a range of 11 mm±25%.

When the clamp arms 11a and 11b are formed so that the ratio R exceeds 1/5, as one example, as depicted in FIG. 10, when clamping one out of a large number of conductors 400 disposed side by side at narrow intervals, it was clear from the results of experiments by the present inventors that it is difficult to insert the front ends 21a and 21b of the clamp arms 11a and 11b into the narrow gaps G1 and G2 between the adjacent conductors 400. On the other hand, when the clamp arms 11a and 11b are formed so that the ratio R is less than 1/6, the separation distance D102 in the state where the front ends 21a and 21b are separated by the maximum amount, that is, when the lever 30a is pressed in by the maximum amount, is too long, so that when a large number of conductors 400 are disposed side by side at narrow intervals, there is the risk that a plurality of the conductors 400 will be clamped when attempting to clamp just one of the conductors 400. This may make it necessary for the user to vary how hard the lever 30a is pressed, which results in poor operability. Conversely, with this clamp sensor 2, by forming the clamp arms 11a and 11b so that the ratio R is within the range of at least 1/6 but no greater than 1/5, it is possible to easily insert the front ends 21a and 21b into the narrow gaps G1 and G2 between adjacent conductors 400 in a state where the lever 30a has been pressed in by the maximum amount. This means that with the clamp sensor 2, it is not necessary to vary how hard the lever 30a is pressed, which sufficiently improves operability.

In the clamp sensor 2, as described above, the base end portions 52a and 52b of the clamp arms 11a and 11b are formed so as to be substantially rectangular in cross-section, and as depicted in FIG. 4, the clamp arms 11a and 11b are formed so that the front end portions 51a and 51b are narrower than the base end portions 52a and 52b, that is, as depicted in FIG. 6, so that the area Sa1 of the outer form of the section Sc1 at the front end portions 51a and 51b is smaller than the area Sa2 of the outer form of the section Sc2 at the base end portions 52a and 52b. In other words, the clamp arms 11a and 11b are formed so that the base end portions 52a and 52b are thicker than the front end portions 51a and 51b, that is, the area of the section Sc2 at the base end portions 52a and 52b is larger than the area of the section Sc1 at the front end portions 51a and 51b. This means that with this clamp sensor 2, compared to a configuration where clamp arms 11a and 11b are formed so that the area of the section Sc1 at the front end portions 51a and 51b is the same as the area of the section Sc2 at the base end portions 52a and 52b, the strength of the clamp arms 11a and 11b is sufficiently increased.

Also, as described above, in the clamp sensor 2, parts between the front ends 21a and 21b and the boundary plane Sb1, which is perpendicular to the straight line H1 and passes the defined point P101 (defined in a range centered on the centroid C1 in plan view of the magnetic circuit Mc and having a length L101 equivalent to 40% of the distance D101 from the top end 100a to the centroid C1), are defined as the front end portions 51a and 51b and parts between the base ends 22a and 22b and the boundary plane Sb1 are defined as the base end portions 52a and 52b. When a plane that passes through a point that is close to the top end 100a and is beyond the range of the length L101 is defined as the boundary plane Sb1, the length of the front end portions 51a and 51b whose area Sa is small (that is, are narrow) is reduced, and when clamping one out of a large number of conductors 400 disposed so as to be aligned side by side at narrow intervals, it is difficult to insert the front ends 21a and 21b of the clamp arms 11a and 11b deeply into the narrow gaps G1 and G2 between adjacent conductors 400. On the other hand, when a plane that passes through a point that is close to the base end 100b and is beyond the range of the length L101 is defined as the boundary plane Sb1, the length of the base end portions 52a and 52b whose area Sa is large (that is, are thick) is reduced, which lowers the strength of the clamp arms 11a and 11b. Conversely, in this clamp sensor 2, since a plane that passes through the defined point P101 defined within the range of the length L101 is defined as the boundary plane Sb1, it is possible to easily insert the front ends 21a and 21b of the clamp arms 11a and 11b deeply into the narrow gaps G1 and G2 between adjacent conductors 400 without reducing the strength of the clamp arms 11a and 11b.

As depicted in FIG. 2, the main body 3 includes a display 31, an operator 32, a processor 33, and the main body case 30 (see FIGS. 1, 3, and 4) where these components are housed or disposed.

The display 31 is composed of a liquid crystal panel for example, and is disposed on a front panel of the main body case 30 as depicted in FIGS. 1, 3, and 4. The display 31 displays a measured value of current and the like according to control by the processor 33. The operator 32 is configured to include various switches 32a, dials 32b, and the like disposed on the front panel of the main body case 30, and outputs operation signals in keeping with operations of these parts.

The processor 33 controls the components that construct the main body 3 according to the operation signals outputted from the operator 32. The processor 33 functions as a meter, measures a current value of the current flowing through the conductor 400 based on the detection signal outputted from the clamp sensor 2 (the magnetic detection element), and displays the current value on the display 31.

Next, a method of using the clamp meter 1 and operations of the clamp meter 1 when doing so will be described with reference to the drawings. As one example, a usage method when measuring the current value of the current flowing through one (for example, the conductor 400a in FIG. 10) out of a plurality of conductors 400 disposed side by side at narrow intervals as depicted in FIG. 10 will be described. In this example, it is assumed that a plurality of conductors 400 with a diameter of 21 mm are disposed side by side at intervals of 12 mm (so that the gaps between the adjacent conductors 400 are 12 mm).

First, the lever 30a (see FIGS. 1 and 4) on the main body 3 of the clamp meter 1 is pressed in. At this time, the clamp arm 11b rotates in a direction where the front ends 21a and 21b of the clamp arms 11a and 11b of the clamp sensor 2 open up against the biasing force of a spring (not illustrated), thereby placing the clamp arms 11a and 11b in the opened state as depicted in FIG. 3.

Next, as depicted in FIG. 10, the front ends 21a and 21b of the clamp arms 11a and 11b are brought close to the conductor 400a to be measured (the "clamped object"). After this, as depicted in FIG. 11, the clamp meter 1 is tilted so as to rotate with the length direction of the clamp meter 1 (the direction that connects the top end 100a and the base end 100b of the ring-shaped body 100 depicted in FIG. 4) as the rotational axis, the front end 21a of the clamp arm 11a is inserted into the gap G1 between the conductor 400a and a conductor 400b adjacent on the right of the conductor 400a, and the front end 21b of the clamp arm 11b is inserted into the gap G2 between the conductor 400a and a conductor 400c adjacent on the left of the conductor 400a.

Here, as depicted by the broken lines in FIG. 7, with the conventional configuration where the outer form of the section Sc1 at each of the front end portions 51a and 51b of the clamp arms 11a and 11b is rectangular (that is, a configuration where the corners of a rectangular pillar are not chamfered), the distance (the diagonal distance D5 depicted in FIG. 7) between opposing corners of the rectangle that is the outer form of the section Sc1 is longer than the opposing distance D1 between the edges E1 and the opposing distance D2 between the edges E2. This means that with the conventional configuration, when the gap G1 between the conductors 400a and 400b and the gap G2 between the conductors 400a and 400c are narrow as depicted in FIG. 11, it is difficult to insert the front ends 21a and 21b of the clamp arms 11a and 11b into the respective gaps G1 and G2 when the clamp meter 1 is tilted.

On the other hand, with the clamp sensor 2, as described above, the front end portions 51a and 51b of the clamp arms 11a and 11b are formed as octagonal pillars where the outer form of the section Sc1 is octagonal due to the corners of a rectangular pillar being chamfered, and the length L2 of the edges E3 and E4 of the octagon that is the outer form of the section Sc1 is longer than the length L1 of the edges E1 and E2. This means that in this clamp sensor 2, the opposing distance D3 between the edges E3 and the opposing distance D4 between the edges E4 are shorter than the opposing distance D1 between the edges E1 and the opposing distance D2 between the edges E2. Accordingly, with this clamp sensor 2, compared to the conventional configuration, it is possible to easily insert the front ends 21a and 21b of the clamp arms 11a and 11b into the narrow gaps G1 and G2 in a state where the clamp meter 1 is tilted.

Also, with the clamp sensor 2, as described above, since the clamp arms 11a and 11b are formed so that the ratio R of the opposing distance D1, which is the longest distance between any two points on the outer form of the section Sc1 at the front end portions 51a and 51b, to the separation distance D102, which is the distance between the front ends 21a and 21b of the clamp arms 11a and 11b in a state where the front ends 21a and 21b are separated by the maximum amount, is within a range of at least 1/6 but no greater than 1/5, in a state where the lever 30a is pressed in by the maximum amount, it is possible to easily insert the front ends 21a and 21b into the narrow gaps G1 and G2 between the adjacent conductors 400. This means that with the clamp sensor 2, it is not necessary to vary how hard the lever 30a is pressed, which makes it possible to sufficiently improve operability.

Figure 12:
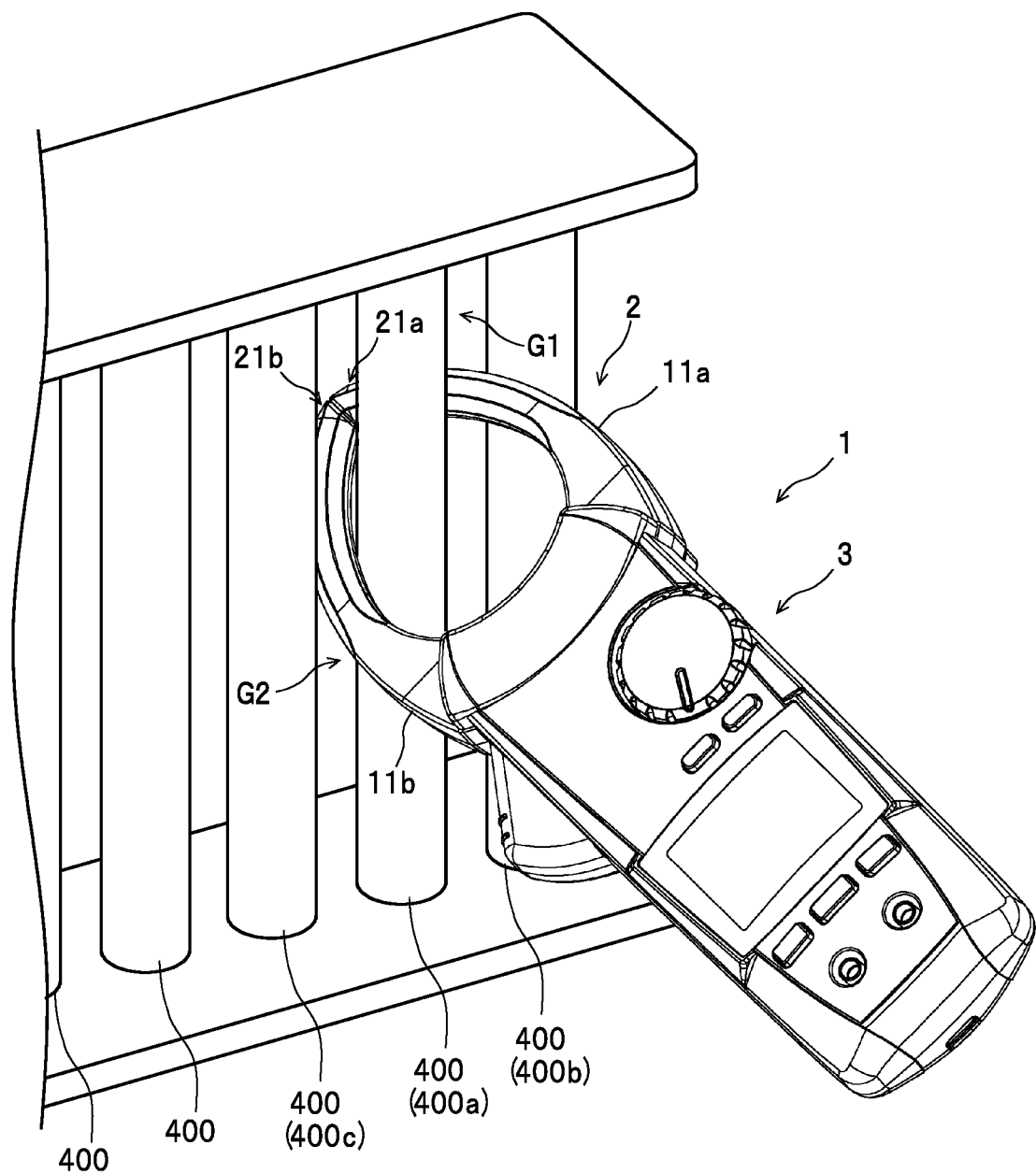
FIG. 12 is a third diagram useful in explaining a method of using the clamp meter 1.

After this, in a state where the front ends 21a and 21b of the clamp arms 11a and 11b have been inserted into the gaps G1 and G2, respectively, the pressing of the lever 30a is released. At this time, due to the biasing force of the spring (not illustrated), the clamp arm 11b rotates in a direction where the front ends 21a and 21b of the clamp arms 11a and 11b come into contact, which produces the closed state of the clamp arms 11a and 11b as depicted in FIG. 12. By doing so, the conductor 400a is clamped by the clamp arms 11a and 11b as depicted in FIG. 12.

Here, with this clamp sensor 2, as described above, parts between the front ends 21a and 21b of the clamp arms 11a and 11b and the boundary plane Sb1, which passes the defined point P101 (defined in a range with a length L101 equivalent to 40% of the distance D101 from the top end 100a to the centroid C1 in plan view of the magnetic circuit Mc), are defined as the front end portions 51a and 51b, parts between the base ends 22a and 22b of the clamp arms 11a and 11b and the boundary plane Sb1 are defined as the base end portions 52a and 52b, and the clamp arms 11a and 11b are formed so that the area Sa1 of the outer form of the section Sc1 at the front end portions 51a and 51b is smaller than the area Sa2 of the outer form of the section Sc2 at the base end portions 52a and 52b. This means that with the clamp sensor 2, the front ends 21a and 21b of the clamp arms 11a and 11b can be easily inserted deeply into the narrow gaps G1 and G2 between the adjacent conductors 400 without reducing the strength of the clamp arms 11a and 11b. Accordingly, it is possible to reliably clamp the conductor 400a with the clamp sensor 2.

The magnetic detection element disposed on the clamp arm 11a then detects the magnetic field that has been generated in the cores of the clamp arms 11a and 11b by the current flowing through the conductor 400a, and outputs a detection signal. Here, in the clamp sensor 2, as described above, the clamp arms 11a and 11b are formed so that the length L103 along the straight line H1 between the outer facing surface 101 of the ring-shaped body 100 and the position P that is 15 mm from the center of the top end 100a along a direction that is perpendicular to the straight line H1 and parallel to the plane of the opening F in the ring-shaped body 100 is within the range of at least 9 mm but no greater than 11 mm. This means that the clamp sensor 2 is capable of maintaining favorable detection characteristics for magnetic fields. Accordingly, the clamp sensor 2 is capable of outputting a detection signal capable of accurately measuring the current flowing through the conductor 400a. After this, the processor 33 of the main body 3 measures the current value of the current flowing through the conductor 400a based on the detection signal. The processor 33 then displays the measured value on the display 31.

Next, when measurement has been completed, the lever 30a is pressed in to open the clamp arms 11a and 11b, and then the clamp sensor 2 is pulled away from the conductor 400a. After this, the pressing of the lever 30a is released, which places the clamp arms 11a and 11b in the closed state.

In this way, with the clamp sensor 2 and the clamp meter 1, the front end portions 51a and 51b of the clamp arms 11a and 11b are formed so that out of the edges constructing the outer form (in this example, an octagonal or substantially octagonal shape) of the section Sc1, the length L2 of the edges E3 and E4 (or the length L2 of a segment that joins both ends of an edge E3 or E4) is longer than the length L1 of the edges E1 and E2. This means that in the clamp sensor 2 and the clamp meter 1, the opposing distance D3 between the edges E3 and the opposing distance D4 between the edges E4 can be made shorter than the opposing distance D1 between the edges E1 and the opposing distance D2 between the edges E2. As a result, according to the clamp sensor 2 and the clamp meter 1, compared to the conventional configuration in which the outer form of the section Sc1 at each of the front end portions 51a and 51b of the clamp arms 11a and 11b is rectangular and the diagonal distance D5 of the section Sc1 is longer than the opposing distance D1 between the edges E1 and the opposing distance D2 between the edges E2 (that is, a configuration where the corners of a rectangular pillar are not chamfered), it is possible to easily insert the front ends 21a and 21b of the clamp arms 11a and 11b into the narrow gaps G1 and G2 in a state where the clamp meter 1 is tilted. Accordingly, with the clamp sensor 2 and the clamp meter 1, the conductor 400 that is the clamped object can be reliably clamped, even when another conductor 400 or an obstacle is present in the vicinity of the conductor 400 that is the clamped object.

Also, according to the clamp sensor 2 and the clamp meter 1, by forming the front end portions 51a and 51b of the clamp arms 11a and 11b so that the length L2 of all of the edges E3 and E4 (or the length L2 of every line segment that joins both ends of an edge E3 or E4) is longer than the length L1 of the edges E1 and E2, it is possible to make both the opposing distance D3 between the edges E3 and the opposing distance D4 between the edges E4 shorter than the opposing distance D1 between the edges E1 and the opposing distance D2 between the edges E2. This means that even when the clamp meter 1 is tilted so as to rotate in either of the clockwise or counterclockwise directions with the length direction of the clamp meter 1 as the axis, it is possible to easily insert the front ends 21a and 21b of the clamp arms 11a and 11b into the narrow gaps G1 and G2.

Also, with the clamp sensor 2 and the clamp meter 1, the clamp arms 11a and 11b are formed so that the thickness T of the front end parts of the sensor cases 10a and 10b that construct the outer shells of the clamp arms 11a and 11b is uniform (or substantially uniform) when viewed at the section Sc1. This means that according to the clamp sensor 2 and the clamp meter 1, compared to a configuration where the thickness T of the front end parts of the sensor cases 10a and 10b is non-uniform, it is possible to avoid concentration of stress in parts of the sensor cases 10a and 10b where the thickness is low and to increase the strength of the sensor cases 10a and 10b. It is therefore possible to reliably avoid damage to the sensor cases 10a and 10b when a load is applied to the sensor cases 10a and 10b.

According to the clamp sensor 2 and the clamp meter 1, by forming the clamp arms 11a and 11b so that the area of the section Sc2 at the base end portions 52a and 52b is larger than the area of the section Sc1 at the front end portions 51a and 51b, compared to a configuration where the clamp arms 11a and 11b are formed so that the area of the section Sc1 at the front end portions 51a and 51b and the area of the section Sc2 at the base end portions 52a and 52b are the same, it is possible to sufficiently increase the strength of the clamp arms 11a and 11b.

Also, with the clamp sensor 2 and the clamp meter 1, the clamp arms 11a and 11b are formed so that the area Sa1 of the outer form of the section Sc1 at the front end portions 51a and 51b between the front ends 21a and 21b and the boundary plane Sb1, which is perpendicular to the straight line H1 (which passes the top end 100a of the ring-shaped body 100 and the centroid C1 in plan view of the magnetic circuit Mc) and passes a point in a range on the straight line H1 that is centered on the centroid C1 and has a length L101 equivalent to 40% of the distance D101 from the top end 100a to the centroid C1, is smaller than the area Sa2 of the outer form of the section Sc2 at the base end portions 52a and 52b between the boundary plane Sb1 and the base ends 22a and 22b. Here, when a plane that passes through a point that is close to the top end 100a and is beyond the range of the length L101 is defined as the boundary plane Sb1, the length of the front end portions 51a and 51b whose area Sa1 is small (that is, narrow) is reduced, and when clamping one out of a large number of conductors 400 disposed so as to be aligned side by side at narrow intervals, it is difficult to insert the front ends 21a and 21b of the clamp arms 11a and 11b deeply into the narrow gaps G1 and G2 between the adjacent conductors 400. On the other hand, when a plane that passes through a point that is close to the base end 100b and is beyond the range of the length L101 is defined as the boundary plane Sb1, the length of the base end portions 52a and 52b whose area Sa2 is large (that is, thick) is reduced, which lowers the strength of the clamp arms 11a and 11b. Conversely, in this clamp sensor 2, since a plane that passes through the defined point P101 defined within the range of the length L101 is defined as the boundary plane Sb1, it is possible to easily insert the front ends 21a and 21b of the clamp arms 11a and 11b deeply into the narrow gaps G1 and G2 between the adjacent conductors 400 without reducing the strength of the clamp arms 11a and 11b. Accordingly, by using the clamp sensor 2, the conductor 400a can be reliably clamped.

Also, with the clamp sensor 2 and the clamp meter 1, the clamp arms 11a and 11b are formed so that the facing surfaces 101 on the outer circumferential sides of the front ends 21a and 21b of the clamp arms 11a and 11b are formed so as to produce a single flat surface that is perpendicular to a direction that connects the top end 100a and the base end 100b of the ring-shaped body 100 in the state where the ring-shaped body 100 is formed and the opposing distance D1a between the facing surfaces 101 at the front ends 21a and 21b is shorter than the opposing distance D1b between the facing surfaces 101 at other parts of the clamp arms 11a and 11b aside from the front ends 21a and 21b. This means that according to the clamp sensor 2 and the clamp meter 1, the front ends 21a and 21b of the clamp arms 11a and 11b can be inserted even more easily into the narrow gaps G1 and G2. Also, since the opposing distance D1a between the facing surfaces 101 at the front ends 21a and 21b is short, even when an obstacle such as a wall is present behind the conductor 400 that is the clamped object and the gap between the conductor 400 and the obstacle is narrow, it is still possible to reliably clamp the conductor 400 that is the clamped object while avoiding contact between the obstacle and the clamp arms 11a and 11b.

Also, in the clamp sensor 2 and the clamp meter 1, the clamp arms 11a and 11b are formed so that the length L103 along the straight line H1 between the outer facing surface 101 of the ring-shaped body 100 and the position P that is 15 mm from the center of the top end 100a along a direction that is perpendicular to the straight line H1 and parallel to the plane of the opening F in the ring-shaped body 100 is within the range of at least 9 mm but no greater than 11 mm. Here, when the clamp arms 11a and 11b are formed so that the length L103 exceeds 11 mm, the shape of the front ends 21a and 21b sides of the clamp arms 11a and 11b is too slender, so that as one example, when a conductor 400 disposed in the vicinity of a wall surface is to be clamped by the clamp arms 11a and 11b, there is the risk of the front ends 21a and 21b of the clamp arms 11a and 11b contacting the wall surface, which makes clamping difficult. Also, when the clamp arms 11a and 11b are formed so that the length L103 exceeds 11 mm, the top end 100a side of the ring-shaped body 100 will become extremely slender and the detection characteristics for magnetic fields (the detected value) may deteriorate. On the other hand, when the clamp arms 11a and 11b are formed so that the length L103 is less than 9 mm, the shape of the front ends 21a and 21b sides of the clamp arms 11a and 11b will be close to an arc shape, and when attempting, for example, to clamp one conductor 400 out of a plurality of conductors 400 disposed close to each other with the clamp arms 11a and 11b, it is difficult to insert the front ends 21a and 21b into gaps between other adjacent conductors 400, which makes clamping difficult. Conversely, with the clamp sensor 2, by forming the clamp arms 11a and 11b so that the length L103 is within the range of at least 9 mm but no greater than 11 mm, it is possible to reliably clamp a conductor 400 while favorably maintaining the detection characteristics for magnetic fields.

With the clamp sensor 2 and the clamp meter 1, the clamp arms 11a and 11b are formed so that the opposing distance D1 that is the longest distance between any two points on the outer form of the section Sc1 at the front end portions 51a and 51b is within a range of at least 1/6 but no greater than 1/5 of the separation distance D102 between the front ends 21a and 21b of the clamp arms 11a and 11b in a state where the front ends 21a and 21b are separated by the maximum amount. Here, if the clamp arms 11a and 11b are formed so that the ratio R exceeds 1/5, when clamping one out of a large number of conductors 400 disposed side by side at narrow intervals, it is difficult to insert the front ends 21a and 21b of the clamp arms 11a and 11b into the narrow gaps G1 and G2 between the adjacent conductors 400. On the other hand, when the clamp arms 11a and 11b are formed so that the ratio R is less than 1/6, the separation distance D102 in a state where the lever 30a is pressed in by the maximum amount and the front ends 21a and 21b are separated by the maximum amount is too long, so that when a large number of conductors 400 are disposed side by side at narrow intervals, there is the risk that a plurality of the conductors 400 will be clamped. This may make it necessary for the user to vary how hard the lever 30a is pressed, which results in poor operability. Conversely, with this clamp sensor 2, by forming the clamp arms 11a and 11b so that the opposing distance D1 is within the range of at least 1/6 but no greater than 1/5 of the separation distance D102, it is possible to easily insert the front ends 21a and 21b into the narrow gaps G1 and G2 between adjacent conductors 400 in a state where the lever 30a has been pressed in by the maximum amount. This means that while sufficiently improving operability, it is possible to clamp one out of a plurality of the conductors 400 even more reliably.

Note that the configurations of the clamp sensor and the measuring device are not limited to the configurations described above. As one example, although an example where only the front end portions 51a and 51b of the clamp arms 11a and 11b are formed so that the outer form of the section Sc1 is octagonal, the length L2 of the edges E3 and E4 out of the edges of the octagon are longer than the length L1 of the edges E1 and E2 and the base end portions 52a and 52b of the clamp arms 11a and 11b are formed so as to be substantially rectangular in cross-section, it is also possible to use a configuration where both the front end portions 51a and 51b and the base end portions 52a and 52b of the clamp arms 11a and 11b are formed with the shape described earlier. By using this configuration, it becomes easy to insert both the front end portions 51a and 51b and the base end portions 52a and 52b of the clamp arms 11a and 11b into narrow gaps.

It is also possible to use a configuration where both the front end portions 51a and 51b and the base end portions 52a and 52b of the clamp arms 11a and 11b are formed so that the edges E3 and E4 are both curved (arc-shaped).

Also, although an example where the front end portions 51a and 51b of the clamp arms 11a and 11b are formed so that the edges E1 and E2 of the octagon, which is the outer form of the section Sc1, have the same length L1 and the edges E3 and E4 have the same length L2 has been described above, it is also possible to use a configuration where the front end portions 51a and 51b (or both the front end portions 51a and 51b and the base end portions 52a and 52b) of the clamp arms 11a and 11b are formed so that the edges E1 and E2 are different lengths and/or the edges E3 and E4 are different lengths.

Also, although an example where the front end portions 51a and 51b of the clamp arms 11a and 11b are formed so that the length L2 of all of the edges E3 and E4 is longer than the length L1 of the edges E1 and E2 has been described, so long as a condition that the length of at least one out of the edges E3 and E4 is longer than the shortest length out of the edges E1 and E2 is satisfied, it is possible to arbitrarily set the lengths of the edges E1, E2, E3, and E4.

Also, although an example where the clamp arms 11a and 11b are formed so that one part of the outer circumference of the top end 100a of the ring-shaped body 100 (the portion indicated by the broken line in FIG. 8) is cut away so that the opposing distance D1a between the facing surfaces 101 at the front ends 21a and 21b is shorter than the opposing distance D1b between the facing surfaces 101 at other parts of the clamp arms 11a and 11b aside from the front ends 21a and 21b, it is also possible to use a configuration where one part of the outer circumference of the top end 100a (the portion indicated by the broken line in FIG. 8) is not cut away.

Also, although an example where the clamp sensor 2 detects a magnetic field as the detected value and the processor 33 measures the current as the measured value is described above, the detected value and/or the measured value are not limited to a magnetic field and current and instead include various physical quantities such as voltage, power, and resistance.

Figure 13:
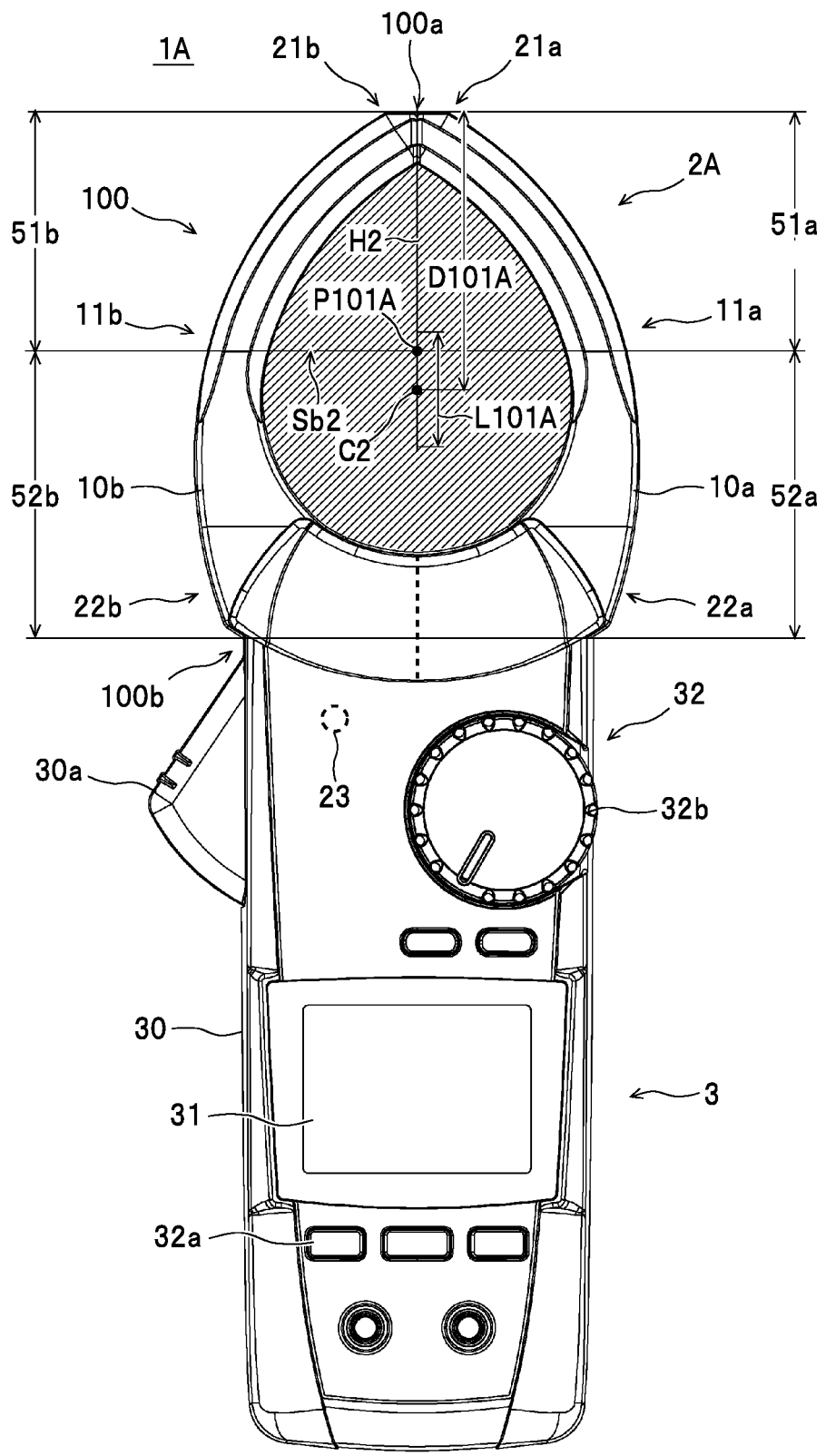
FIG. 13 is a front view of a clamp meter 1A.

It is also possible to use a clamp meter 1A including a clamp sensor 2A and the main body 3 depicted in FIG. 13. Note that in the following description, component elements that are the same as the clamp sensor 2 and the clamp meter 1 described above have been assigned the same reference numerals and duplicated description is omitted.

In this clamp sensor 2A, the front end portions 51a and 51b and the base end portions 52a and 52b are defined as follows. First, as depicted in FIG. 13, a straight line H2 that passes the top end 100a of the ring-shaped body 100 and a centroid C2 in plan view (the obliquely shaded shape in FIG. 13) of the inner circumference of the ring-shaped body 100 is defined. Next, a length L101A equivalent to 40% of a distance D101A (the straight line distance) from the top end 100a (in more detail, the outer facing surface 101 at the top end 100a depicted in FIG. 8) to the centroid C2 is specified, and any point (hereinafter, also referred to the "defined point P101A") is defined on the straight line H2 in a range that is centered on the centroid C2 and has the length L101A. Here, in this example, a point separated from the centroid C2 toward the top end 100a by a length corresponding to 14% of the distance D101 is defined as the "defined point P101A". After this, a plane that passes through the defined point P101A and is perpendicular to the straight line H2 is defined as a "boundary plane Sb2", the parts between the boundary plane Sb2 and the front ends 21a and 21b of the clamp arms 11a and 11b are defined as the "front end portions 51a and 51b" and the parts between the boundary plane Sb1 and the base ends 22a and 22b are defined as the "base end portions 52a and 52b".

In this clamp sensor 2A, as depicted in FIG. 7, the front end portions 51a and 51b of the clamp arms 11a and 11b are formed in the same shape as the equivalent portions of the clamp sensor 2. Also in this clamp sensor 2A, as depicted in FIG. 6, the clamp arms 11a and 11b are formed so that the area Sa1 of the outer form of the section Sc1 at the front end portions 51a and 51b is smaller than the area Sa2 of the outer form of the section Sc2 at the base end portions 52a and 52b. This means that with the clamp sensor 2A, in the same way as the clamp sensor 2, it is possible to easily insert the front ends 21a and 21b of the clamp arms 11a and 11b deeply into the narrow gaps G1 and G2 between adjacent conductors 400 without reducing the strength of the clamp arms 11a and 11b. Accordingly, the conductor 400 can be reliably clamped using the clamp sensor 2.

With this clamp sensor 2A also, as depicted in FIG. 8, the clamp arms 11a and 11b are formed so that the length L103 along the straight line H1 between the outer facing surface 101 of the ring-shaped body 100 and the position P that is 15 mm from the center of the top end 100a along a direction that is perpendicular to the straight line H1 and parallel to the plane of the opening F in the ring-shaped body 100 is within the range of at least 9 mm but no greater than 11 mm. This means that in the same way as the clamp sensor 2, the clamp sensor 2A is capable of reliably clamping the conductor 400 while favorably maintaining favorable detection characteristics for magnetic fields.

In this clamp sensor 2A also, as depicted in FIG. 9, the clamp arms 11a and 11b are formed so that when the longest distance out of straight line distances between any two points on the outer form of the section Sc1 at the front end portions 51a and 51b is set as the opposing distance D1 (see FIG. 7) and a distance between the front ends 21a and 21b of the clamp arms 11a and 11b in a state where the front ends 21a and 21b are separated by the maximum amount is set as the separation distance D102, the ratio R of the opposing distance D1 to the separation distance D102 is within the range of at least 1/6 but no greater than 1/5. This means that with the clamp sensor 2A, in the same way as the clamp sensor 2, the front ends 21a and 21b can be easily inserted into the narrow gaps G1 and G2 between the adjacent conductors 400 in a state where the lever 30a has been pressed in by the maximum amount. It is therefore possible to more reliably clamp only one out of the plurality of conductors 400 while sufficiently improving the operability.

It is also possible to use a clamp sensor 202 depicted in FIG. 7. In this clamp sensor 202, in the same way as the clamp sensor 2 described above, the front end portions 51a and 51b of the clamp arms 11a and 11b include a pair of facing surfaces 101, a pair of facing surfaces 102, a pair of facing surfaces 103, and a pair of facing surfaces 104, so that as depicted in FIG. 7, the outer form of the section Sc1 that is perpendicular to the length direction of the clamp arms 11a and 11b is formed in an octagonal shape (one example of a substantially octagonal shape) as one example (that is, the front end portions 51a and 51b are octagonal pillars where the corners of a rectangular pillar depicted by the broken lines in FIG. 7 have been chamfered).

Also, in this clamp sensor 202, as depicted in FIG. 5, in the same way as the clamp sensor 2 described above, parts between the front ends 21a and 21b and the boundary plane Sb1, which is perpendicular to the straight line H1 and passes the defined point P101 (defined on the straight line H1 in the range that is centered on the centroid C1 and has the length L101), are defined as the front end portions 51a and 51b, and parts between the boundary plane Sb1 and the base ends 22a and 22b are defined as the base end portions 52a and 52b. Note that as depicted in FIG. 13, in the same way as the clamp sensor 2A described above, it is also possible to use a configuration where parts between the front ends 21a and 21b and the boundary plane Sb2 that is perpendicular to the straight line H2 and passes the defined point P101A (defined on the straight line H2 in the range that is centered on the centroid C2 and has the length L101A) are defined as the front end portions 51a and 51b and parts between the boundary plane Sb2 and the base ends 22a and 22b are defined as the base end portions 52a and 52b.

Also, in the clamp sensor 202, as depicted in FIG. 7, parts of the front end portions 51a and 51b of the clamp arms 11a and 11b aside from the front ends 21a and 21b are formed so that out of the edges of the octagon that is the outer form of the section Sc1, edges E1 that correspond to the facing surfaces 101 and edges E2 that correspond to the facing surfaces 102 have the same length L1 and edges E3 that correspond to the facing surfaces 103 and edges E4 that correspond to the facing surfaces 104 have the same length L2. Also, in the clamp sensor 202, the front end portions 51a and 51b are formed so that the opposing distance D1 between the edges E1 and the opposing distance D2 between the edges E2 are the same distance and the opposing distance D3 between the edges E3 (the opposing distance between a segment that joins both ends of one edge E3 and a segment that joins both ends of the other edge E3) and the opposing distance D4 between the edges E4 (the opposing distance between a segment that joins both ends of one edge E4 and a segment that joins both ends of the other edge E4) are the same distance. In addition, in the clamp sensor 202, the front end portions 51a and 51b are formed so that the opposing distances D3 and D4 are within the range of over $(100/\sqrt{2})\%$ but no greater than 110% (as one example, 99%) of the opposing distances D1 and D2 (that is, the shorter distance out of the opposing distances D1 and D2).

Here, in a configuration in which the opposing distances D3 and D4 are $(100/\sqrt{2})\%$ or less of the opposing distances D1 and D2, the shape of the section Sc1 becomes thin (a shape that is vertically or horizontally elongated), and since the cores 41 also become thin due to this, there is the risk of deterioration in the magnetic characteristics and a fall in detection accuracy for the detected value. On the other hand, in a configuration where the opposing distances D3 and D4 are longer than 110% of the opposing distances D1 and D2, it is difficult to sufficiently achieve the effects, described later, produced by shortening the opposing distances D3 and D4. Accordingly, to sufficiently achieve the effects of shortening the opposing distances D3, D4 while keeping the detection accuracy for the detected value high, this clamp sensor 202 uses a configuration where the opposing distances D3 and D4 are set within the range of over $(100/\sqrt{2})\%$ but no greater than 110% of the opposing distances D1 and D2.

Note that in the example depicted in FIG. 7, since the edges E3 are both straight, the opposing distance between a segment that joins both ends of one of the edges E3 and a segment that joins both ends of the other edge E3 and the opposing distance between the edges E3 themselves are the same. However, it is also possible to use a configuration where the edges E3 are curved (arc-shaped) (a configuration where the outer form of the section Sc1 is substantially octagonal), and with this configuration, the front end portions 51a and 51b are formed so that an opposing distance between a segment that joins both ends of one of the edges E3 and a segment that joins both ends of the other edge E3 is set as the opposing distance D3 and this opposing distance D3 is within the range of over $(100/\sqrt{2})\%$ but no greater than 110% of the opposing distances D1 and D2. In the same way, in the example depicted in FIG. 7, since the edges E4 are both straight, the opposing distance between a segment that joins both ends of one of the edges E4 and a segment that joins both ends of the other edge E4 and the opposing distance between the edges E4 themselves are the same. However, it is also possible to use a configuration where the edges E4 are curved (arc-shaped) (a configuration where the outer form of the section Sc1 is substantially octagonal), and with this configuration, the front end portions 51a and 51b are formed so that an opposing distance between a segment that joins both ends of one of the edges E4 and a segment that joins both ends of the other edge E4 is set as the opposing distance D4 and this opposing distance D4 is in the range of over $(100/\sqrt{2})\%$ but no greater than 110% of the opposing distances D1 and D2.

In the clamp sensor 202 also, as depicted in FIG. 7, the sensor cases 10a and 10b that construct the outer shells of the clamp arms 11a and 11b are formed so that the thickness T of parts corresponding to the front end portions 51a and 51b (hereinafter, referred to as the "front end parts of the sensor cases 10a and 10b") is uniform (or substantially uniform) when viewed at the section Sc1.

In the clamp sensor 202 also, as depicted in FIG. 6, the clamp arms 11a and 11b are formed so that the base end portions 52a and 52b of the clamp arms 11a and 11b are substantially rectangular in cross-section and the area Sa2 of the outer form of the section Sc2 at the base end portions 52a and 52b are larger than the area Sa1 of the outer form of the section Sc1 at the front end portions 51a and 51b (that is, so that the area Sa1 is smaller than the area Sa2).

In this clamp sensor 202 also, as depicted in FIG. 8, the facing surfaces 101 that construct the outer circumference surface of the ring-shaped body 100 at the front ends 21a and 21b of the clamp arms 11a and 11b are formed so as to produce a single flat surface that is perpendicular to a direction that connects the top end 100a and the base end 100b of the ring-shaped body 100 in a state where the ring-shaped body 100 is formed. By forming the facing surfaces 101 in this way, in the clamp sensor 202, the clamp arms 11a and 11b are formed so that the opposing distance D1a between the facing surfaces 101 at the front ends 21a and 21b is shorter than the opposing distance D1b between the facing surfaces 101 at other parts of the clamp arms 11a and 11b aside from the front ends 21a and 21b. This means that according to the clamp sensor 202, the length of the ring-shaped body 100 along the direction that joins the top end 100a and the base end 100b is reduced by the reduction in the opposing distance D1a between the facing surfaces 101 at the front ends 21a and 21b.

Here, as depicted by the broken lines in FIG. 7, with the conventional configuration where the outer form of the section Sc1 at each of the front end portions 51a and 51b of the clamp arms 11a and 11b is rectangular (that is, a configuration where the corners of a rectangular pillar are not chamfered), the distance (the diagonal distance D5 depicted in FIG. 7) between opposing corners of the rectangle that is the outer form of the section Sc1 is around 141% of the opposing distance D1 between the edges E1 and the opposing distance D2 between the edges E2 (when the section Sc1 is square). This means that with the conventional configuration, when the gap G1 between the conductors 400a and 400b and the gap G2 between the conductors 400a and 400c are narrow as depicted in FIG. 11, it is difficult to insert the front ends 21a and 21b of the clamp arms 11a and 11b into the respective gaps G1 and G2 when the clamp meter 1 is tilted.

On the other hand, with the clamp sensor 202 and the clamp meter 1 equipped with the clamp sensor 202, as described above, the front end portions 51a and 51b of the clamp arms 11a and 11b are formed so that out of the edges that construct the outer form of the section Sc1 (in this example, an octagonal or substantially octagonal shape), the opposing distance D3 between the edges E3 (or the opposing distance D3 between a segment that joins both ends of one edge E3 and a segment that joins both ends of the other edge E3) and the opposing distance D4 between the edges E4 (or the opposing distance D4 between a segment that joins both ends of one edge E4 and a segment that joins both ends of the other edge E4) are within the range of over $(100/\sqrt{2})\%$ but no greater than 110% of the opposing distance D1 between the edges E1 and the opposing distance D2 between the edges E2. This means that with the clamp sensor 202 and the clamp meter 1, the opposing distances D3 and D4 can be made sufficiently shorter than the diagonal distance D5 of the section Sc1 in the conventional configuration, so that compared to the conventional configuration, the front ends 21a and 21b of the clamp arms 11a and 11b can be easily inserted into the narrow gaps G1 and G2 (see FIGS. 10 to 12) in a state where the clamp meter 1 is tilted. Accordingly, with the clamp sensor 202 and the clamp meter 1, the conductor 400 that is the clamped object can be reliably clamped, even when another conductor 400 or an obstacle is present in the vicinity of the conductor 400 that is the clamped object.

Also, according to the clamp sensor 202 and the clamp meter 1, by forming the front end portions 51a and 51b of the clamp arms 11a and 11b so that both the opposing distances D3 and D4 (or both the opposing distance D3 between a segment that joins both ends of one of the edges E3 and a segment that joins both ends of the other edge E3 and the opposing distance D4 between a segment that joins both ends of one of the edges E4 and a segment that joins both ends of the other edge E4) are within the range of over $(100/\sqrt{2})$% but no greater than 110% of the opposing distances D2 and D3, it is possible to make both the opposing distances D3 and D4 sufficiently shorter than the diagonal distance D5 of the section Sc1 in the conventional configuration. This means that according to the clamp sensor 202 and the clamp meter 1, the front ends 21a and 21b of the clamp arms 11a and 11b can be easily inserted into the narrow gaps G1, G2, even in a state where for example the clamp meter 1 is tilted so as to rotate in either the clockwise or counterclockwise direction with the length direction of the clamp meter 1 as the rotational axis.

Also, in the clamp sensor 202 and the clamp meter 1, since the clamp arms 11a and 11b are formed so that the thickness T of the front end parts of the sensor cases 10a and 10b that construct the outer shells of the clamp arms 11a and 11b is uniform (or substantially uniform) when viewed at the section Sc1, compared to a configuration where the thickness T of the front end parts of the sensor cases 10a and 10b is non-uniform, it is possible to avoid concentration of stress in parts of the sensor cases 10a and 10b where the thickness is low and to increase the strength of the sensor cases 10a and 10b. It is therefore possible to reliably avoid damage to the sensor cases 10a and 10b when a load is applied to the sensor cases 10a and 10b.

In the clamp sensor 202 and the clamp meter 1 also, by forming the clamp arms 11a and 11b so that the area of the section Sc2 at the base end portions 52a and 52b is larger than the area of the section Sc1 at the front end portions 51a and 51b, compared to a configuration where the clamp arms 11a and 11b are formed so that the area of the section Sc1 at the front end portions 51a and 51b and the area of the section Sc2 at the base end portions 52a and 52b are the same, it is possible to sufficiently increase the strength of the clamp arms 11a and 11b.

In this clamp sensor 202 also, as described above, the clamp arms 11a and 11b are formed so that the area Sa1 of the outer form of the section Sc1 at the front end portions 51a and 51b is smaller than the area Sa2 of the outer form of the section Sc2 at the base end portions 52a and 52b (see FIG. 6). This means that according to the clamp sensor 202, in the same way as the clamp sensor 2, it is possible to easily insert the front ends 21a and 21b of the clamp arms 11a and 11b deeply into the narrow gaps G1 and G2 between the adjacent conductors 400 without reducing the strength of the clamp arms 11a and 11b. Accordingly, it is possible to reliably clamp the conductor 400 using the clamp sensor 202.

With the clamp sensor 202 also, as depicted in FIG. 8, the clamp arms 11a and 11b are formed so that the length L103 along the straight line H1 between the outer facing surface 101 of the ring-shaped body 100 and the position P that is 15 mm from the center of the top end 100a along a direction that is perpendicular to the straight line H1 and parallel to the plane of the opening F in the ring-shaped body 100 is within the range of at least 9 mm but no greater than 11 mm. This means that according to the clamp sensor 202, in the same way as the clamp sensor 2, it is possible to reliably clamp the conductor 400 while maintaining favorable detection characteristics for magnetic fields.

In the clamp sensor 202 also, as depicted in FIG. 9, the clamp arms 11a and 11b are formed so that when the longest distance out of straight line distances between any two points on the outer form of the section Sc1 at the front end portions 51a and 51b is set as the opposing distance D1 (see FIG. 7) and a distance between the front ends 21a and 21b of the clamp arms 11a and 11b in a state where the front ends 21a and 21b are separated by the maximum amount is set as the separation distance D102, the ratio R of the opposing distance D1 to the separation distance D102 is within the range of at least 1/6 but no greater than 1/5. This means that according to the clamp sensor 202, in the same way as the clamp sensor 2, it is possible to easily insert the front ends 21a and 21b into the narrow gaps G1 and G2 between the adjacent conductors 400 in a state where the lever 30a is pressed in by the maximum amount. This means that it is possible to clamp one out of a plurality of conductors 400 even more reliably while sufficiently improving operability.

With the clamp sensor 202 and the clamp meter 1 also, by forming the clamp arms 11a and 11b so that the facing surfaces 101 on the outer circumferential sides of the front ends 21a and 21b of the clamp arms 11a and 11b are formed so as to produce a single flat surface that is perpendicular to a direction that connects the top end 100a and the base end 100b of the ring-shaped body 100 in the state where the ring-shaped body 100 is formed and the opposing distance D1a between the facing surfaces 101 at the front ends 21a and 21b is shorter than the opposing distance D1b between the facing surfaces 101 at other parts of the clamp arms 11a and 11b aside from the front ends 21a and 21b, it is possible to insert the front ends 21a and 21b of the clamp arms 11a and 11b into the narrow gaps G1 and G2 even more easily. Since the opposing distance D1a between the facing surfaces 101 at the front ends 21a and 21b is short, even when for example an obstacle such as a wall is present behind the conductor 400 that is the clamped object and the gap between the conductor 400 and the obstacle is narrow, it is still possible to reliably clamp the conductor 400 that is the clamped object while avoiding contact between the obstacle and the clamp arms 11a and 11b.

Note that with this clamp sensor 202 also, it is possible to use a configuration where the base end portions 52a and 52b of the clamp arms 11a and 11b are formed in the same shape as the front end portions 51a and 51b. It is also possible for the clamp sensor 202 to use a configuration where the edges E1 and E2 of the octagon, which is the outer form of the section Sc1, have different lengths and/or the edges E3 and E4 have different lengths. With the clamp sensor 202, it is possible to use a configuration in which the opposing distances D1 and D2 are different lengths and the opposing distances D3 and D4 are different lengths. It is also possible for the clamp sensor 202 to use a configuration where the front end portions 51a and 51b are formed so that only one of the opposing distances D3 and D4 is within the range of over $(100/\sqrt{2})$% but no greater than 110% of the opposing distances D1 and D2 (that is, the shorter distance out of the opposing distance D1 and D2). In the clamp sensor 202 also, it is possible to use a configuration where both the front end portions 51a and 51b and the base end portions 52a and 52b of the clamp arms 11a and 11b are formed so that the edges E3 and E4 are curved (arc-shaped). With the clamp sensor 202 also, it is also possible to use a configuration where one part on the outer circumference of the top end 100a of the ring-shaped body 100 (the portion indicated by the broken line in FIG. 8) is not cut away.

It is also possible to use a clamp sensor 302 depicted in FIG. 7. In the same way as the clamp sensor 2 described above, in the clamp sensor 302, the front end portions 51a and 51b of the clamp arms 11a and 11b include a pair of facing surfaces 101, a pair of facing surfaces 102, a pair of facing surfaces 103, and a pair of facing surfaces 104, and as depicted in FIG. 7, the outer form of the section Sc1 that is perpendicular to the length direction of the clamp arms 11a and 11b is octagonal or substantially octagonal, for example (an octagonal pillar where the corners of a rectangular pillar depicted by the broken line in FIG. 7 have been chamfered).

In the clamp sensor 302, as depicted in FIG. 5, in the same way as the clamp sensor 2 described above, parts between the front ends 21a and 21b and the boundary plane Sb1, which is perpendicular to the straight line H1 and passes the defined point P101 (defined on the straight line H1 in the range that is centered on the centroid C1 and has the length L101), are defined as the front end portions 51a and 51b, and parts between the base ends 22a and 22b and the boundary plane Sb1 are defined as the base end portions 52a and 52b. Note that as depicted in FIG. 13, in the same way as the clamp sensor 2A described above, it is also possible to use a configuration where parts between the front ends 21a and 21b and the boundary plane Sb2 that is perpendicular to the straight line H2 and passes the defined point P101A (defined on the straight line H2 in the range that is centered on the centroid C2 and has the length L101A) are defined as the front end portions 51a and 51b and parts between the boundary plane Sb2 and the base ends 22a and 22b are defined as the base end portions 52a and 52b.

With this clamp sensor 302, as depicted in FIG. 7, parts of the front end portions 51a and 51b of the clamp arms 11a and 11b aside from the front ends 21a and 21b are formed so that out of the edges of the octagon that is the outer form of the section Sc1, the edges E1 that correspond to the facing surfaces 101 and the edges E2 that correspond to the facing surfaces 102 have the same length L1 and the edges E3 that correspond to the facing surfaces 103 and the edges E4 that correspond to the facing surfaces 104 have the same length L2. Also, in the clamp sensor 302, the front end portions 51a and 51b are formed so that the length L2 of the edges E3 and E4 is within a range of at least 57% but less than 1000% (as one example, 106%) of the length L1 of the edges E1 and E2 (that is, the shortest length out of the lengths of the edges E1 and E2).

Here, in a configuration where the length L2 is 1000% or more of the length L1, the shape of the section Sc1 becomes thin (a shape that is vertically or horizontally elongated), and since the cores 41 also become thin due to this, there is the risk of deterioration in the magnetic characteristics and a fall in the detection accuracy for the detected value. On the other hand, in a configuration where the length L2 is below 57% of the length L1, it is difficult to sufficiently achieve the effects, described later, produced by chamfering the corners of a rectangular pillar and somewhat increasing the length L2. Accordingly, in the clamp sensor 2, to sufficiently achieve the effects of somewhat increasing the length L2 while keeping the detection accuracy for the detected value high, a configuration where the length L2 is within the range of at least 57% but less than 1000% of the length L1 is used.

Note that in the example depicted in FIG. 7, since the edges E3 and E4 are both straight, the lengths of the segments that join both ends of the edges E3 and E4 are the same as the edges E3 and E4. However, it is also possible to use a configuration where the edges E3 and E4 are curved (arc-shaped) (a configuration where the outer form of the section Sc1 is substantially octagonal), and for this configuration, the length of a segment that joins both ends of the edges E3 and E4 is treated as the length L2 and the front end portions 51a and 51b are formed so that the length L2 is within the range of at least 57% but less than 1000% of the length L1 (the shortest length out of the lengths of the edges E1 and E2).

In the clamp sensor 302 also, as depicted in FIG. 7, the sensor cases 10a and 10b that construct the outer shells of the clamp arms 11a and 11b are formed so that the thickness T of parts corresponding to the front end portions 51a and 51b (hereinafter, referred to as the "front end parts of the sensor cases 10a and 10b") is uniform (or substantially uniform) when viewed at the section Sc1.

In the clamp sensor 302 also, the clamp arms 11a and 11b are formed so that the base end portions 52a and 52b of the clamp arms 11a and 11b are formed so as to be substantially rectangular in cross-section and the area of the section Sc2 at the base end portions 52a and 52b is larger than the area of the section Sc1 at the front end portions 51a and 51b (that is, so that the area Sa1 is smaller than the area Sa2).

In this clamp sensor 302 also, as depicted in FIG. 8, the facing surfaces 101 that construct the outer circumferential surface of the ring-shaped body 100 at the front ends 21a and 21b of the clamp arms 11a and 11b are formed so as to produce a single flat surface that is perpendicular to a direction that connects the top end 100a and the base end 100b of the ring-shaped body 100 in a state where the ring-shaped body 100 is formed. By forming the facing surfaces 101 in this way, in the clamp sensor 302, the clamp arms 11a and 11b are formed so that the opposing distance D1a between the facing surfaces 101 at the front ends 21a and 21b is shorter than the opposing distance D1b between the facing surfaces 101 at other parts of the clamp arms 11a and 11b aside from the front ends 21a and 21b. This means that according to the clamp sensor 302, the length of the ring-shaped body 100 along the direction that connects the top end 100a and the base end 100b is shorter by the reduction in the opposing distance D1a between the facing surfaces 101 at the front ends 21a and 21b.

Here, as depicted by the broken lines in FIG. 7, with the conventional configuration where the outer form of the section Sc1 at each of the front end portions 51a and 51b of the clamp arms 11a and 11b is rectangular (that is, a configuration where the corners of a rectangular pillar are not chamfered), the distance (the diagonal distance D5 depicted in FIG. 7) between opposing corners of the rectangle that is the outer form of the section Sc1 is longer than the opposing distance D1 between the edges E1 and the opposing distance D2 between the edges E2. This means that with the conventional configuration, when the gap G1 between the conductors 400a and 400b and the gap G2 between the conductors 400a and 400c are narrow as depicted in FIG. 11, it is difficult to insert the front ends 21a and 21b of the clamp arms 11a and 11b into the respective gaps G1 and G2 when the clamp meter 1 is tilted.

On the other hand, with the clamp sensor 302 and a clamp meter 1 equipped with the clamp sensor 302, as described above, the front end portions 51a and 51b of the clamp arms 11a and 11b are formed so that the length L2 of the edges E3 and E4 (or the length L2 of segments that join both ends of the edges E3 and E4) out of the edges that construct the outer form (in this example, octagonal or substantially octagonal) of the section Sc1 where the corners of a rectangular pillar have been chamfered is within the range of at least 57% but less than 1000% of the length L1 of the edges E1 and E2. This means that according to the clamp sensor 302 and the clamp meter 1, by somewhat increasing the length L2, the opposing distances D3 and D4 are sufficiently shorter than the diagonal distance D5 of the section Sc1 in the conventional configuration, so that compared to the conventional configuration, it is possible to easily insert the front ends 21a and 21b of the clamp arms 11a and 11b into the narrow gaps G1 and G2 (see FIGS. 10 to 12) in a state where the clamp meter 1 is tilted. Accordingly, with the clamp sensor 302 and the clamp meter 1, even if another conductor 400 or an obstacle is present in the vicinity of the conductor 400 that is the clamped object, it is still possible to reliably clamp the conductor 400 that is the clamped object.

Also, with the clamp sensor 302 and the clamp meter 1, by forming the front end portions 51a and 51b of the clamp arms 11a and 11b so that the length L2 of every edge E3 and E4 (or the length L2 of every segment that joins both ends of the edges E3 and E4) is within the range of at least 57% but less than 1000% of the length L1 of the edges E1 and E2, it is possible to make both of the opposing distances D3 and D4 sufficiently shorter than the diagonal distance D5 of the section Sc1 in the conventional configuration. This means that according to the clamp sensor 302 and the clamp meter 1, the front ends 21a and 21b of the clamp arms 11a and 11b can be easily inserted into the narrow gaps G1 and G2, even when for example the clamp meter 1 is tilted so as to rotate in either the clockwise or counterclockwise direction with the length direction of the clamp meter 1 as the rotational axis.

Also, with the clamp sensor 302 and the clamp meter 1, since the clamp arms 11a and 11b are formed so that the thickness T of the front end parts of the sensor cases 10a and 10b that construct the outer shells of the clamp arms 11a and 11b is uniform (or substantially uniform) when viewed at the section Sc1, compared to a configuration where the thickness T of the front end parts of the sensor cases 10a and 10b is non-uniform, it is possible to avoid concentration of stress in parts of the sensor cases 10a and 10b where the thickness T is low and to increase the strength of the sensor cases 10a and 10b. It is therefore possible to reliably avoid damage to the sensor cases 10a and 10b when a load is applied to the sensor cases 10a and 10b.

Also, with the clamp sensor 302 and the clamp meter 1, by forming the clamp arms 11a and 11b so that the area of the section Sc2 at the base end portions 52a and 52b is larger than the area of the section Sc1 at the front end portions 51a and 51b, compared to a configuration where the clamp arms 11a and 11b are formed so that the area of the section Sc1 at the front end portions 51a and 51b and the area of the section Sc2 at the base end portions 52a and 52b are the same, it is possible to sufficiently increase the strength of the clamp arms 11a and 11b.

With this clamp sensor 302 also, as described above, the clamp arms 11a and 11b are formed so that the area Sa1 of the outer form of the section Sc1 at the front end portions 51a and 51b is smaller than the area Sa2 of the outer form of the section Sc2 at the base end portions 52a and 52b (see FIG. 6). This means that according to the clamp sensor 302, in the same way as the clamp sensor 2, it is possible to easily insert the front ends 21a and 21b of the clamp arms 11a and 11b deeply into the narrow gaps G1 and G2 between adjacent conductors 400 without reducing the strength of the clamp arms 11a and 11b. Accordingly, it is possible to reliably clamp the conductor 400 using the clamp sensor 302.

In the clamp sensor 302 also, as depicted in FIG. 8, the clamp arms 11a and 11b are formed so that the length L103 along the straight line H1 between the outer facing surface 101 of the ring-shaped body 100 and the position P that is 15 mm from the center of the top end 100a along a direction that is perpendicular to the straight line H1 and parallel to the plane of the opening F in the ring-shaped body 100 is within the range of at least 9 mm but no greater than 11 mm. This means that according to the clamp sensor 302, in the same way as the clamp sensor 2, it is possible to reliably clamp the conductor 400 while maintaining favorable detection characteristics for magnetic fields.

Also, with the clamp sensor 302, as depicted in FIG. 9, the clamp arms 11a and 11b are formed so that when the longest distance out of straight line distances between any two points on the outer form of the section Sc1 at the front end portions 51a and 51b is set as the opposing distance D1 (see FIG. 7) and a distance between the front ends 21a and 21b of the clamp arms 11a and 11b in a state where the front ends 21a and 21b are separated by the maximum amount is set as the separation distance D102, the ratio R of the opposing distance D1 to the separation distance D102 is within the range of at least 1/6 but no greater than 1/5. This means that according to the clamp sensor 302, in the same way as the clamp sensor 2, it is possible to easily insert the front ends 21a and 21b into the narrow gaps G1 and G2 between the adjacent conductors 400 in a state where the lever 30a is pressed in by the maximum amount. This means that it is possible to clamp one out of a plurality of conductors 400 even more reliably while sufficiently improving operability.

With the clamp sensor 302 and the clamp meter 1 also, by forming the clamp arms 11a and 11b so that the facing surfaces 101 on the outer circumferential sides of the front ends 21a and 21b of the clamp arms 11a and 11b are formed so as to produce a single flat surface that is perpendicular to a direction that connects the top end 100a and the base end 100b of the ring-shaped body 100 in the state where the ring-shaped body 100 is formed and the opposing distance D1a between the facing surfaces 101 at the front ends 21a and 21b is shorter than the opposing distance D1b between the facing surfaces 101 at other parts of the clamp arms 11a and 11b aside from the front ends 21a and 21b, it is possible to insert the front ends 21a and 21b of the clamp arms 11a and 11b even more easily into the narrow gaps G1 and G2. Since the opposing distance D1a between the facing surfaces 101 at the front ends 21a and 21b is short, even when for example an obstacle such as a wall is present behind the conductor 400 that is the clamped object and the gap between the conductor 400 and the obstacle is narrow, it is still possible to reliably clamp the conductor 400 that is the clamped object while avoiding contact between the obstacle and the clamp arms 11a and 11b.

Note that with this clamp sensor 302 also, it is possible to use a configuration where the base end portions 52a and 52b of the clamp arms 11a and 11b are formed in the same shape as the front end portions 51a and 51b. It is also possible for the clamp sensor 302 to use a configuration where the edges E1 and E2 of the octagon, which is the outer form of the section Sc1, have different lengths, and/or where the edges E3 and E4 have different lengths. Also, with the clamp sensor 302, so long as a condition that at least one length of the edges E3 and E4 is in the range of at least 57% but less than 1000% of the shortest length out of the lengths of the edges E1 and E2, it is possible to set the edges E1, E2, E3, and E4 at arbitrary lengths. With the clamp sensor 302 also, it is possible to use a configuration where both the front end portions 51a and 51b and the base end portions 52a and 52b of the clamp arms 11a and 11b are formed so that the edges E3 and E4 are curved (arc-shaped). It is also possible for the clamp sensor 302 to use a configuration where one part of the outer circumference of the top end 100a of the ring-shaped body (the portion indicated by the broken line in FIG. 8) is not cut away.

Although examples where the front end portions 51a and 51b of the clamp arms 11a and 11b are formed so that the outer form of the section Sc1 at the front end portions 51a and 51b is substantially octagonal have been described above, it is also possible to form the front end portions 51a and 51b so that the outer form of the section Sc1 is a polygonal shape aside from a substantially octagonal shape (as examples, a substantially 12-sided or 16-sided shape). As one example, it is possible to use the clamp sensor 402 depicted in FIG. 14.

In this clamp sensor 402, the front end portions 51a and 51b of the clamp arms 11a and 11b have a pair of facing surfaces 101 that correspond to first facing surfaces, a pair of facing surfaces 102 that correspond to second facing surfaces, and a pair of facing surfaces 103a, a pair of facing surfaces 103b, a pair of facing surfaces 104a, and a pair of facing surfaces 104b (which all correspond to "third facing surfaces", and are a total of four pairs of third facing surfaces as one example of a plurality of pairs) that are inclined with respect to the facing surfaces 101 and 102, so that the outer form of the section Sc1 that is perpendicular to the length direction of the clamp arms 11a and 11b is formed in a substantially 12-sided shape. Note that since the front end portions 51a and 51b have the same cross-sectional form, only the cross-sectional form of the front end portion 51a is depicted in FIG. 14 and the cross-sectional form of the front end portion 51b is omitted.

Figure 14:
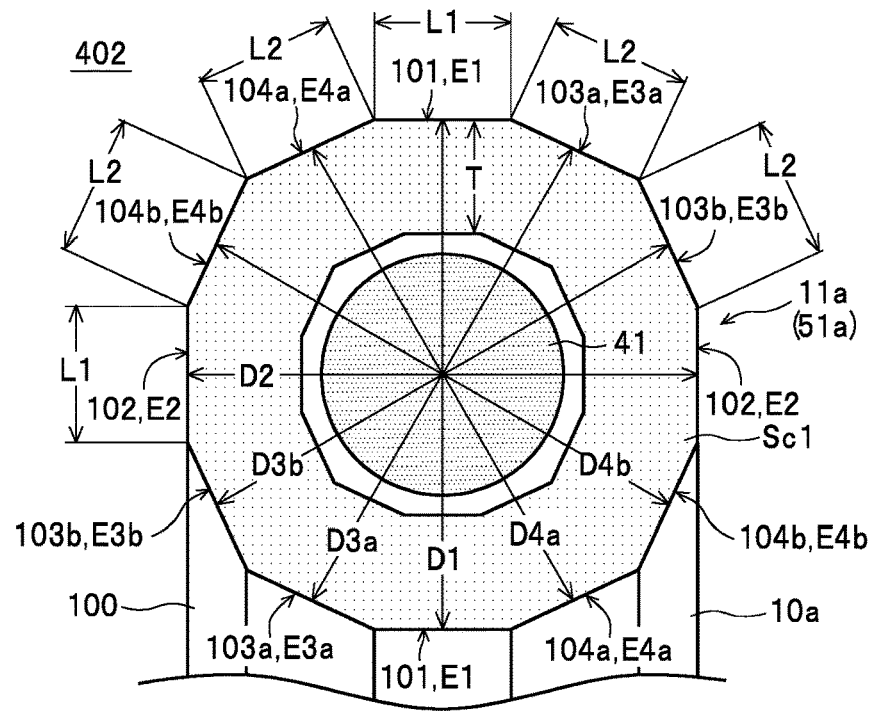
FIG. 14 is a cross-sectional view depicting the configuration of a clamp sensor 402.

As depicted in FIG. 14, in the clamp sensor 402, parts of the front end portions 51a and 51b of the clamp arms 11a and 11b aside from the front ends 21a and 21b are formed so that out of the edges of the 12-sided shape that is the outer form of the section Sc1, the edges E1 that correspond to the facing surfaces 101 and the edges E2 that correspond to the facing surfaces 102 are the same length L1, and the lengths of the edges E3a and E3b that correspond to the facing surfaces 103a and 103b (or lengths of segments that join both ends of the edges E3a and E3b) and the edges E4a and E4b that correspond to the facing surfaces 104a and 104b (or lengths of segments that join both ends of the edges E4a and E4b) are the same length L2. In addition, in the clamp sensor 402, the front end portions 51a and 51b are formed so that the length L2 is longer than the length L1 (a shortest length out of the lengths of the edges E1 and E2).

With this clamp sensor 402 also, as depicted in FIG. 14, the sensor cases 10a and 10b that construct the outer shells of the clamp arms 11a and 11b are formed so that the thickness T of the parts corresponding to the front end portions 51a and 51b (hereinafter, referred to as the "front end parts of the sensor cases 10a and 10b") is uniform (or substantially uniform) when viewed at the section Sc1. This means that according to the clamp sensor 402, compared to a configuration where the thickness T of the front end parts of the sensor cases 10a and 10b is non-uniform, it is possible to avoid concentration of stress in parts of the sensor cases 10a and 10b where the thickness is low and to increase the strength of the sensor cases 10a and 10b. It is therefore possible to reliably avoid damage to the sensor cases 10a and 10b when a load is applied to the sensor cases 10a and 10b.

Note that in the clamp sensor 402, as depicted in FIG. 14, it is possible to form the front end portions 51a and 51b so that the opposing distance D1 between the edges E1 and the opposing distance D2 between the edges E2 in the 12-sided shape that is the outer form of the section Sc1 are the same distance, the opposing distances D3a and D3b between the edges E3a and E3b (the opposing distance between a segment that joins both ends of one of the edges E3a and E3b and a segment that joins both ends of the other of the edges E3a and E3b) and the opposing distances D4a and D4b between the edges E4a and E4b (the opposing distance between a segment that joins both ends of one of the edges E4a and E4b and a segment that joins both ends of the other of the edges E4a and E4b) are the same distance, and the opposing distances D3a, D3b, D4a, and D4b are within a range of over $(100/\sqrt{2})$% but no greater than 110% (as one example, 99%) of the opposing distances D1 and D2 (the shorter of the opposing distances D1 and D2). In this case also, the effects described above can be achieved.

Also in the clamp sensor 402, as depicted in FIG. 14, it is possible to form the front end portions 51a and 51b so that the length L2 of the edges E3a, E3b, E4a, and E4b in the 12-sided shape that is the outer form of the section Sc1 is within a range of at least 57% but less than 1000% (as one example, 106%) of the length L1 of the edges E1 and E2 (the shortest length out of the lengths of the edges E1 and E2). In this case also, the effects described above can be achieved.

Also, when there are three pairs or five or more pairs of third facing surfaces that are inclined with respect to the first facing surfaces and the second facing surfaces and the number of pairs of third facing surfaces is expressed as "n", it is possible to use a configuration where the outer form of the section Sc1 is a variety of polygonal shapes that are substantially (4+2n) sided shapes (where n is a natural number of 2 or higher). In this case also, the effects described above can be achieved.

It is also possible to use a configuration where the front end portions 51a and 51b are formed so that part of the outer form of the section Sc1 is curved. As an example, the clamp sensor 502 depicted in FIG. 15 can be used. Note that since the front end portions 51a and 51b have the same cross-sectional form, only the cross-sectional form of the front end portion 51a is depicted in FIG. 15 and the cross-sectional form of the front end portion 51b is omitted.

Figure 15:
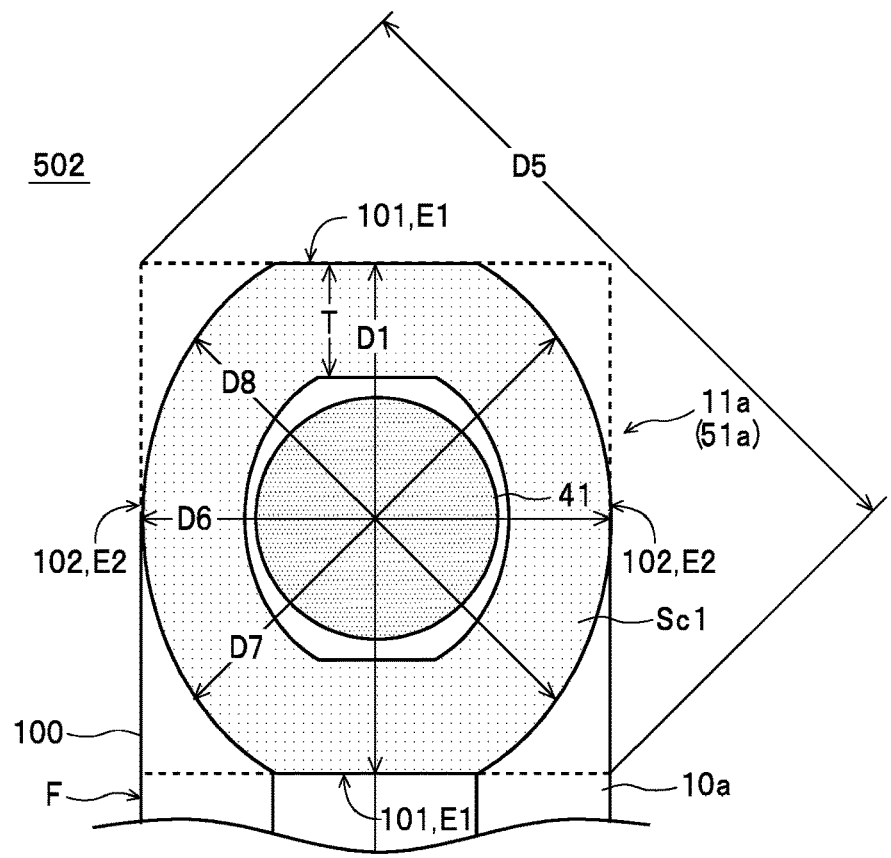
FIG. 15 is a cross-sectional view depicting the configuration of a clamp sensor 502.

As depicted in FIG. 15, in the clamp sensor 502, the front end portions 51a and 51b of the clamp arms 11a and 11b have the pair of facing surfaces 101 (which correspond to first facing surfaces) that construct the outer circumferential surface and the inner circumferential surface of the ring-shaped body 100 and the pair of facing surfaces 102 (which correspond to second facing surfaces) that construct two side surfaces of the ring-shaped body 100. The outer shape of the section Sc1 that is perpendicular to the length direction of the clamp arms 11a and 11b is formed in a shape produced by cutting away both ends in the major axis of an oval along a direction perpendicular to the plane of the opening F in the ring-shaped body 100 (the left-right direction in FIG. 15). In this clamp sensor 502, out of the edges that construct the outer form of the section Sc1, the edges E1 that correspond to the facing surfaces 101 are formed so as to be straight and the edges E2 that correspond to the facing surfaces 102 are formed so as to be arcs that are outwardly curved (a shape where the corners of a rectangular pillar depicted by the broken lines in FIG. 15 have been chamfered). In this clamp sensor 502, the front end portions 51a and 51b of the clamp arms 11a and 11b are formed so that the longest opposing distance D6 between the edges E2 along the direction perpendicular to the plane of the opening F of the ring-shaped body 100 is no greater than the opposing distance D1 between the edges E1. In this clamp sensor 502, since the front end portions 51a and 51b of the clamp arms 11a and 11b are formed in this way, as depicted in FIG. 15, the longest opposing distances D7 and D8 between the edges E2 are no greater than the opposing distance D1 between the edges E1. Note that in FIG. 15, an example where the opposing distance D1 and the opposing distances D7 and D8 are equal is depicted.

In the clamp sensor 502, as depicted in FIG. 15 also, the sensor cases 10a and 10b that construct the outer shells of the clamp arms 11a and 11b are formed so that the thickness T of the parts corresponding to the front end portions 51a and 51b (hereinafter, referred to as the "front end parts of the sensor cases 10a and 10b") is uniform (or substantially uniform) when viewed at the section Sc1.

According to the clamp sensor 502 and a clamp meter 1 equipped with the clamp sensor 502, by forming the front end portions 51a and 51b of the clamp arms 11a and 11b so that out of the edges that construct the outer form of the section Sc1, the edges E1 are straight and the edges E2 are formed so as to be arcs that are outwardly curved, it is possible to make the longest opposing distances D7 and D8 between the edges E2 no greater than the opposing distance D1 between the edges E1. This means that compared to the conventional configuration (a configuration where the corners of a rectangular pillar are not chamfered) where the outer form of the section Sc1 at the front end portions 51a and 51b of the clamp arms 11a and 11b is rectangular and the diagonal distance D5 of the section Sc1 is longer than the opposing distance D1 between the edges E1 and the longest opposing distances D7 and D8 between the edges E2, it is possible to easily insert the front ends 21a and 21b of the clamp arms 11a and 11b into narrow gaps G1 and G2 in a state where the clamp meter 1 is tilted. This means that according to the clamp sensor 502 and the clamp meter 1, even when another conductor 400 or an obstacle is present in the vicinity of the conductor 400 that is the clamped object, it is possible to reliably clamp the conductor 400 that is the clamped object.

With the clamp sensor 502 and the clamp meter 1 equipped with the clamp sensor 502, the front end portions 51a and 51b of the clamp arms 11a and 11b are formed so that the longest opposing distance D6 between the edges E2 along the direction perpendicular to the plane of the opening F of the ring-shaped body 100 is no greater than the opposing distance D1 between the edges E1. This means that according to the clamp sensor 502 and the clamp meter 1, by tilting the clamp meter 1 so as to reduce the angle of inclination of the plane of the opening F in the ring-shaped body 100 relative to the direction in which the conductor 400 extends, it is possible to insert the front ends 21a and 21b of the clamp arms 11a and 11b into the narrow gaps G1 and G2 even more easily.

Also, according to the clamp sensor 502 and the clamp meter 1 equipped with the clamp sensor 502, by forming the clamp arms 11a and 11b so that the thickness T of the front end parts of the sensor cases 10a and 10b that construct the outer shells of the clamp arms 11a and 11b are uniform (or substantially uniform) when looking from the section Sc1, compared to a configuration where the thickness T of the front end parts of the sensor cases 10a and 10b is non-uniform, it is possible to avoid concentration of stress in parts of the sensor cases 10a and 10b where the thickness is low and to increase the strength of the sensor cases 10a and 10b. It is therefore possible to reliably avoid damage to the sensor cases 10a and 10b when a load is applied to the sensor cases 10a and 10b.

Figure 16:
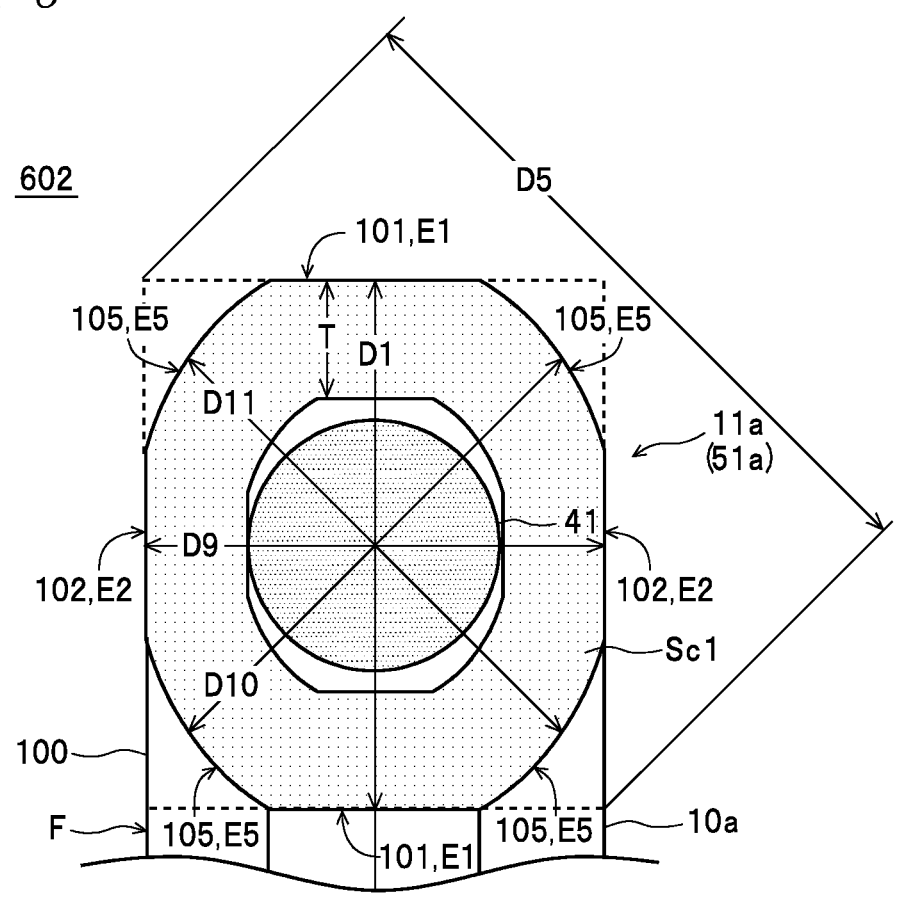
FIG. 16 is a cross-sectional view depicting the configuration of a clamp sensor 602.

Also, as another example of a configuration where the front end portions 51a and 51b are formed so that part of the outer form of the section Sc1 is formed by curves, it is also possible to use a clamp sensor 602 depicted in FIG. 16. Note that since the cross-sectional form of the front end portions 51a and 51b is the same, only the cross-sectional form of the front end portion 51a is illustrated in FIG. 16 and the cross-sectional form of the front end portion 51b is omitted.

In the clamp sensor 602, as depicted in FIG. 16, the front end portions 51a and 51b of the clamp arms 11a and 11b have a pair of facing surfaces 101 that construct the outer circumferential surface and the inner circumferential surface of the ring-shaped body 100 (and correspond to "first facing surfaces"), a pair of facing surfaces 102 that construct two side surfaces of the ring-shaped body 100 (and correspond to "second facing surfaces"), and two pairs of facing surfaces 105 that are positioned between the facing surfaces 101 and the facing surfaces 102 (and correspond to "fourth facing surfaces"). The outer form of the section Sc1 that is perpendicular to the length direction of the clamp arms 11a and 11b is rectangular with rounded (curved) corners. In the clamp sensor 602, out of the edges that construct the outer form of the section Sc1, the edges E1 that correspond to the facing surfaces 101 and the edges E2 that correspond to the facing surfaces 102 are straight and the edges E5 that correspond to the facing surfaces 105 are arc-shaped so as to be outwardly curved (in a form where the corners of a rectangular pillar indicated by the broken lines in FIG. 16 are chamfered into curved surfaces). Also, with the clamp sensor 602, the front end portions 51a and 51b of the clamp arms 11a and 11b are formed so that the opposing distance D9 between the edges E2 is no greater than the opposing distance D1 between the edges E1. In this clamp sensor 602, by forming the front end portions 51a and 51b of the clamp arms 11a and 11b in this way, as depicted in FIG. 16, the longest opposing distances D10 and D11 between the facing edges E5 are no greater than the opposing distance D1 between the edges E1. Note that in FIG. 16, an example where the opposing distance D1 and the opposing distances D10 and D11 are equal is depicted.

With the clamp sensor 602 also, as depicted in FIG. 16, the sensor cases 10a and 10b that construct the outer shells of the clamp arms 11a and 11b are formed so that the thickness T of parts corresponding to the front end portions 51a and 51b (hereinafter, referred to as "front end parts of the sensor cases 10a and 10b") is uniform (or substantially uniform) when viewed at the section Sc1.

According to the clamp sensor 602 and a clamp meter 1 equipped with this clamp sensor 602, by forming the front end portions 51a and 51b of the clamp arms 11a and 11b so that out of the edges that construct the outer form of the section Sc1, the edges E1 and the edges E2 are straight and the edges E5 are arc-shaped so as to be outwardly curved, it is possible to make the longest opposing distances D10 and D11 between the facing edges E5 no greater than the opposing distance D1 between the edges E1. This means that compared to a conventional configuration (a configuration where the corners of a rectangular pillar are not chamfered)

where the outer form of the section Sc1 at the front end portions 51a and 51b of the clamp arms 11a and 11b is rectangular and the diagonal distance D5 of the section Sc1 is formed so as to be longer than the opposing distance D1 between the edges E1 and the opposing distance D9 of the edges E2, it is possible to easily insert the front ends 21a and 21b of the clamp arms 11a and 11b into the narrow gaps G1 and G2 in a state where the clamp meter 1 is tilted. This means that according to the clamp sensor 602 and the clamp meter 1, even when another conductor 400 or an obstacle is present in the vicinity of the conductor 400 that is the clamped object, it is possible to reliably clamp the conductor 400 that is the clamped object.

According to the clamp sensor 602 and the clamp meter 1 equipped with the clamp sensor 602, the front end portions 51a and 51b of the clamp arms 11a and 11b are formed so that the opposing distance D9 between the edges E2 is no greater than the opposing distance D1 between the edges E1. This means that according to the clamp sensor 602 and the clamp meter 1, by tilting the clamp meter 1 so as to reduce the angle of inclination of the plane of the opening F in the ring-shaped body 100 relative to the direction in which the conductor 400 extends, it is possible to insert the front ends 21a and 21b of the clamp arms 11a and 11b into the narrow gaps G1 and G2 even more easily.

According to the clamp sensor 602 and the clamp meter 1 including the clamp sensor 602, by forming the clamp arms 11a and 11b so that the thickness T of the front end parts of the sensor cases 10a and 10b that construct the outer shells of the clamp arms 11a and 11b is uniform (or substantially uniform) when viewed at the section Sc1, compared to a configuration where the thickness T of the front end parts of the sensor cases 10a and 10b is non-uniform, it is possible to avoid concentration of stress in parts of the sensor cases 10a and 10b where the thickness is low and to increase the strength of the sensor cases 10a and 10b. It is therefore possible to reliably avoid damage to the sensor cases 10a and 10b when a load is applied to the sensor cases 10a and 10b.

Although example configurations where the clamp arm 11b (one of the clamp arms 11a and 11b) is rotatable have been described above, it is also possible to use a configuration where the clamp arm 11a is rotatable and a configuration where both the clamp arms 11a and 11b are rotatable.

INDUSTRIAL APPLICABILITY

According to the present invention, since it is possible to easily insert front ends of the clamp arms into narrow gaps in a state where a measuring device is tilted, even when for example another conductor or an obstacle is present in the vicinity of the conductor that is the clamped object, it is still possible to reliably clamp the conductor that is the clamped object. This means that the present invention can be widely applied to clamp sensors that detect a detected value for a clamped object and to measuring devices that measure a measured value for a clamped object.

REFERENCE SIGNS LIST

1 Clamp meter
2, 2A, 202, 302, 402, 502, 602 Clamp sensor
11a, 11b Clamp arm
21a, 21b Front end
22a, 22b Base end
23 Rotational axis
33 Processor
41 Core
51a, 51b Front end portion
52a, 52b Base end portion
100 Ring-shaped body
100a Top end
400, 400a Conductor
101 to 105, 103a, 103b, 104a, 104b Facing surface
C1, C2 Centroid
D1 to D11 Opposing distance
D102 Separation distance
E1 to E5, E3a, E3b, E4a, E4b Edge
H1, H2 Straight line
L1, L2 Length
L101, L101A, L102, L103 Length
Mc Magnetic circuit
P Position
P101, P101A Defined point
Sa1, Sa2 Area
Sb1, Sb2 Boundary plane
Sc1, Sc2 Section
T Thickness

The invention claimed is:

1. A clamp sensor comprising:
a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed,
wherein the clamp sensor is capable of detecting a detected value of a clamped object in a state where the clamped object is clamped by the clamp arms,
front end portions of the clamp arms have a pair of first facing surfaces that construct an outer circumferential surface and an inner circumferential surface of the ring-shaped body, a pair of second facing surfaces that construct two side surfaces of the ring-shaped body, and a plurality of pairs of third facing surfaces that are inclined with respect to the first facing surfaces and the second facing surfaces,
and the front end portions of the clamp arms are formed so that out of edges that construct an outer form of a section perpendicular to a length direction of each clamp arm, a length of a segment that joins both ends of at least one edge out of the edges that correspond to the third facing surfaces is longer than a shortest length out of lengths of the edges that respectively correspond to the first facing surfaces and the second facing surfaces.

2. The clamp sensor according to claim 1,
wherein the front end portions of the clamp arms are formed so that lengths of all segments that join both ends of the edges that correspond to the third facing surfaces are longer than the shortest length out of lengths of the edges that respectively correspond to the first facing surfaces and the second facing surfaces.

3. A clamp sensor comprising:
a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed,
wherein the clamp sensor is capable of detecting a detected value of a clamped object in a state where the clamped object is clamped by the clamp arms, front end portions of the clamp arms have a pair of first facing surfaces that construct an outer circumferential surface and an inner circumferential surface of the ring-shaped body, a pair of second facing surfaces that construct two side surfaces of the ring-shaped body, and a plurality of pairs of third facing surfaces that are inclined with respect to the first facing surfaces and the second facing surfaces, and the front end portions of the clamp arms are formed so that out of edges that construct an outer form of a section perpendicular to a length direction of each clamp arm, an opposing distance between a segment that joins both ends of one edge out of a pair of facing edges that correspond to the third facing surfaces and a segment that joins both ends of another edge in the pair is within a range of over $(100/\sqrt{2})\%$ but no greater than 110% of a shorter distance out of an opposing distance between edges corresponding to the first facing surfaces and an opposing distance between edges corresponding to the second facing surfaces out of the edges.

4. The clamp sensor according to claim 3, wherein the front end portions of the clamp arms are formed so that the opposing distance between all combinations of the facing edges is within a range of over $(100/\sqrt{2})\%$ but no greater than 110% of the shorter distance out of the opposing distance between edges corresponding to the first facing surfaces and the opposing distance between edges corresponding to the second facing surfaces.

5. A clamp sensor comprising:
a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed,
wherein the clamp sensor is capable of detecting a detected value of a clamped object in a state where the clamped object is clamped by the clamp arms,
front end portions of the clamp arms have a pair of first facing surfaces that construct an outer circumferential surface and an inner circumferential surface of the ring-shaped body, a pair of second facing surfaces that construct two side surfaces of the ring-shaped body, and a plurality of pairs of third facing surfaces that are inclined with respect to the first facing surfaces and the second facing surfaces,
and the front end portions of the clamp arms are formed so that out of edges that construct an outer form of a section perpendicular to a length direction of each clamp arm, a length of a segment that joins both ends of at least one edge out of the edges that correspond to the third facing surfaces is within a range of at least 57% but less than 1000% of a shortest length out of lengths of the edges that respectively correspond to the first facing surfaces and the second facing surfaces.

6. The clamp sensor according to claim 5, wherein the front end portions of the clamp arms are formed so that lengths of all segments that join both ends of edges out of the edges that correspond to the third facing surfaces are within a range of at least 57% but less than 1000% of a shortest length out of lengths of the edges that respectively correspond to the first facing surfaces and the second facing surfaces.

7. A clamp sensor comprising:
a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed,
wherein the clamp sensor is capable of detecting a detected value of a clamped object in a state where the clamped object is clamped by the clamp arms,
front end portions of the clamp arms have a pair of first facing surfaces that construct an outer circumferential surface and an inner circumferential surface of the ring-shaped body and a pair of second facing surfaces that construct two side surfaces of the ring-shaped body, and out of edges that construct an outer form of a section perpendicular to a length direction of each clamp arm, edges corresponding to the first facing surfaces are straight and edges corresponding to the second facing surfaces are arc-shaped so as to be outwardly curved.

8. The clamp sensor according to claim 7, wherein the front end portions of the clamp arms are formed so that a longest opposing distance between edges corresponding to the second facing surfaces along a direction perpendicular to a plane of an opening in the ring-shaped body is no greater than an opposing distance between edges corresponding to the first opposing distance.

9. A clamp sensor comprising:
a pair of clamp arms that are formed so as to be substantially arc-shaped in plan view, that are configured so that at least one of the clamp arms is rotatable so that respective front ends of the clamp arms open and close, and that form a ring-shaped body in a state where the front ends are closed,
wherein the clamp sensor is capable of detecting a detected value of a clamped object in a state where the clamped object is clamped by the clamp arms,
front end portions of the clamp arms have a pair of first facing surfaces that construct an outer circumferential surface and an inner circumferential surface of the ring-shaped body, a pair of second facing surfaces that construct two side surfaces of the ring-shaped body, and two pairs of fourth facing surfaces that are positioned between the first facing surfaces and the second facing surfaces,
and the front end portions of the clamp arms are formed so that out of edges that construct an outer form of a section perpendicular to a length direction of each clamp arm, edges corresponding to the first facing surfaces and edges corresponding to the second facing surfaces are straight and edges corresponding to the fourth facing surfaces are arc-shaped so as to be outwardly curved.

10. The clamp sensor according to claim 9, wherein the front end portions of the clamp arms are formed so that an opposing distance between the edges corresponding to the second facing surfaces is no greater than an opposing distance between the edges corresponding to the first facing surfaces.

11. A clamp sensor according to claim 1, wherein the clamp arms each have a sensor case that constructs an outer shell of the clamp arms, and each sensor case is formed so that a thickness of a part corresponding to a front end of each clamp arm is uniform or substantially uniform when looking from the section.

12. The clamp sensor according to claim 1,
wherein the clamp arms are formed so that an area of the section at base end portions of the clamp arms is larger than an area of the section at the front end portions.

13. The clamp sensor according to claim 12,
wherein the clamp arms each include a core in which a magnetic field is produced by a current flowing in the clamped object,
a plane that passes any point, which is on a straight line that passes a top end of the ring-shaped body corresponding to the front ends and a centroid in plan view of a ring-shaped magnetic circuit formed by the cores when the ring-shaped body is formed and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

14. The clamp sensor according to claim 12,
wherein a plane that passes any point, which is on a straight line that passes a top end of the ring-shaped body corresponding to the front ends and a centroid in plan view of an inner circumference of the ring-shaped body and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

15. The clamp sensor according to claim 1,
wherein the clamp arms are formed so that the first facing surfaces that construct the outer circumferential surface at the front ends of the clamp arms produce a single flat surface that is perpendicular to a direction that connects a front end and a base end of the ring-shaped body in a state where the ring-shaped body is formed,
and an opposing distance between the first facing surfaces at the front ends is shorter than an opposing distance between the first facing surfaces at other parts of the clamp arms aside from the front ends.

16. The clamp sensor according to claim 13,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

17. The clamp sensor according to claim 1,
wherein the clamp arms are formed so that a longest distance out of straight line distances between any two points on the outer form of the section in a part between the boundary plane and the front ends is within a range of at least 1/6 but no greater than 1/5 of a separation distance between the front ends of the clamp arms in a state where the front ends are separated by a maximum amount.

18. A measuring device comprising:
the clamp sensor according to claim 1; and
a meter that measures a measured value for the clamped object based on the detected value detected by the clamp sensor.

19. A clamp sensor according to claim 3,
wherein the clamp arms each have a sensor case that constructs an outer shell of the clamp arms, and
each sensor case is formed so that a thickness of a part corresponding to a front end of each clamp arm is uniform or substantially uniform when looking from the section.

20. A clamp sensor according to claim 5,
wherein the clamp arms each have a sensor case that constructs an outer shell of the clamp arms, and
each sensor case is formed so that a thickness of a part corresponding to a front end of each clamp arm is uniform or substantially uniform when looking from the section.

21. A clamp sensor according to claim 7,
wherein the clamp arms each have a sensor case that constructs an outer shell of the clamp arms, and
each sensor case is formed so that a thickness of a part corresponding to a front end of each clamp arm is uniform or substantially uniform when looking from the section.

22. A clamp sensor according to claim 9,
wherein the clamp arms each have a sensor case that constructs an outer shell of the clamp arms, and
each sensor case is formed so that a thickness of a part corresponding to a front end of each clamp arm is uniform or substantially uniform when looking from the section.

23. The clamp sensor according to claim 3,
wherein the clamp arms are formed so that an area of the section at base end portions of the clamp arms is larger than an area of the section at the front end portions.

24. The clamp sensor according to claim 5,
wherein the clamp arms are formed so that an area of the section at base end portions of the clamp arms is larger than an area of the section at the front end portions.

25. The clamp sensor according to claim 7,
wherein the clamp arms are formed so that an area of the section at base end portions of the clamp arms is larger than an area of the section at the front end portions.

26. The clamp sensor according to claim 9,
wherein the clamp arms are formed so that an area of the section at base end portions of the clamp arms is larger than an area of the section at the front end portions.

27. The clamp sensor according to claim 23,
wherein the clamp arms each include a core in which a magnetic field is produced by a current flowing in the clamped object,
a plane that passes any point, which is on a straight line that passes a top end of the ring-shaped body corresponding to the front ends and a centroid in plan view of a ring-shaped magnetic circuit formed by the cores when the ring-shaped body is formed and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

28. The clamp sensor according to claim 24,
wherein the clamp arms each include a core in which a magnetic field is produced by a current flowing in the clamped object,
a plane that passes any point, which is on a straight line that passes a top end of the ring-shaped body corresponding to the front ends and a centroid in plan view of a ring-shaped magnetic circuit formed by the cores when the ring-shaped body is formed and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

29. The clamp sensor according to claim 25,
wherein the clamp arms each include a core in which a magnetic field is produced by a current flowing in the clamped object,
a plane that passes any point, which is on a straight line that passes a top end of the ring-shaped body corresponding to the front ends and a centroid in plan view of a ring-shaped magnetic circuit formed by the cores when the ring-shaped body is formed and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

30. The clamp sensor according to claim 26,
wherein the clamp arms each include a core in which a magnetic field is produced by a current flowing in the clamped object,
a plane that passes any point, which is on a straight line that passes a top end of the ring-shaped body corresponding to the front ends and a centroid in plan view of a ring-shaped magnetic circuit formed by the cores when the ring-shaped body is formed and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

31. The clamp sensor according to claim 23,
wherein a plane that passes any point, which is on a straight line that passes a top end of the ring-shaped body corresponding to the front ends and a centroid in plan view of an inner circumference of the ring-shaped body and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

32. The clamp sensor according to claim 24,
wherein a plane that passes any point, which is on a straight line that passes a top end of the ring-shaped body corresponding to the front ends and a centroid in plan view of an inner circumference of the ring-shaped body and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

33. The clamp sensor according to claim 25,
wherein a plane that passes any point, which is on a straight line that passes a top end of the ring-shaped body corresponding to the front ends and a centroid in plan view of an inner circumference of the ring-shaped body and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

34. The clamp sensor according to claim 26,
wherein a plane that passes any point, which is on a straight line that passes a top end of the ring-shaped body corresponding to the front ends and a centroid in plan view of an inner circumference of the ring-shaped body and which is in a range that has a length equivalent to 40% of a straight line distance from the top end to the centroid and is centered on the centroid, and is perpendicular to the straight line is set as a boundary plane,
and the clamp arms are formed so that an area of an outer form of the section at parts, as the front end portions, between the boundary plane and the front ends is smaller than an area of an outer form of the section at parts, as the base end portions, between the boundary plane and the base ends.

35. The clamp sensor according to claim 3,
wherein the clamp arms are formed so that the first facing surfaces that construct the outer circumferential surface at the front ends of the clamp arms produce a single flat surface that is perpendicular to a direction that connects a front end and a base end of the ring-shaped body in a state where the ring-shaped body is formed,
and an opposing distance between the first facing surfaces at the front ends is shorter than an opposing distance between the first facing surfaces at other parts of the clamp arms aside from the front ends.

36. The clamp sensor according to claim 5,
wherein the clamp arms are formed so that the first facing surfaces that construct the outer circumferential surface at the front ends of the clamp arms produce a single flat surface that is perpendicular to a direction that connects a front end and a base end of the ring-shaped body in a state where the ring-shaped body is formed,
and an opposing distance between the first facing surfaces at the front ends is shorter than an opposing distance between the first facing surfaces at other parts of the clamp arms aside from the front ends.

37. The clamp sensor according to claim 7,
wherein the clamp arms are formed so that the first facing surfaces that construct the outer circumferential surface at the front ends of the clamp arms produce a single flat surface that is perpendicular to a direction that connects a front end and a base end of the ring-shaped body in a state where the ring-shaped body is formed,
and an opposing distance between the first facing surfaces at the front ends is shorter than an opposing distance between the first facing surfaces at other parts of the clamp arms aside from the front ends.

38. The clamp sensor according to claim 9,
wherein the clamp arms are formed so that the first facing surfaces that construct the outer circumferential surface at the front ends of the clamp arms produce a single flat surface that is perpendicular to a direction that connects a front end and a base end of the ring-shaped body in a state where the ring-shaped body is formed,
and an opposing distance between the first facing surfaces at the front ends is shorter than an opposing distance between the first facing surfaces at other parts of the clamp arms aside from the front ends.

39. The clamp sensor according to claim 27,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

40. The clamp sensor according to claim 28,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

41. The clamp sensor according to claim 29,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

42. The clamp sensor according to claim 30,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

43. The clamp sensor according to claim 14,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

44. The clamp sensor according to claim 31,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

45. The clamp sensor according to claim 32,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

46. The clamp sensor according to claim 33,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

47. The clamp sensor according to claim 34,
wherein the clamp arms are formed so that a length along the straight line between the outer circumferential surface of the ring-shaped body and a position that is 15 mm from a center of the top end along a direction that is perpendicular to the straight line and parallel to a plane of an opening in the ring-shaped body is within a range of at least 9 mm but no greater than 11 mm.

48. The clamp sensor according to claim 3,
wherein the clamp arms are formed so that a longest distance out of straight line distances between any two points on the outer form of the section in a part between the boundary plane and the front ends is within a range of at least 1/6 but no greater than 1/5 of a separation distance between the front ends of the clamp arms in a state where the front ends are separated by a maximum amount.

49. The clamp sensor according to claim 5,
wherein the clamp arms are formed so that a longest distance out of straight line distances between any two points on the outer form of the section in a part between the boundary plane and the front ends is within a range of at least 1/6 but no greater than 1/5 of a separation distance between the front ends of the clamp arms in a state where the front ends are separated by a maximum amount.

50. The clamp sensor according to claim 7,
wherein the clamp arms are formed so that a longest distance out of straight line distances between any two points on the outer form of the section in a part between the boundary plane and the front ends is within a range of at least 1/6 but no greater than 1/5 of a separation distance between the front ends of the clamp arms in a state where the front ends are separated by a maximum amount.

51. The clamp sensor according to claim 9,
wherein the clamp arms are formed so that a longest distance out of straight line distances between any two points on the outer form of the section in a part between the boundary plane and the front ends is within a range of at least 1/6 but no greater than 1/5 of a separation distance between the front ends of the clamp arms in a state where the front ends are separated by a maximum amount.

52. A measuring device comprising:
the clamp sensor according to claim 3; and
a meter that measures a measured value for the clamped object based on the detected value detected by the clamp sensor.

53. A measuring device comprising:
the clamp sensor according to claim 5; and
a meter that measures a measured value for the clamped object based on the detected value detected by the clamp sensor.

54. A measuring device comprising:
the clamp sensor according to claim 7; and
a meter that measures a measured value for the clamped object based on the detected value detected by the clamp sensor.

55. A measuring device comprising:
the clamp sensor according to claim 9; and
a meter that measures a measured value for the clamped object based on the detected value detected by the clamp sensor.

* * * * *